US012490529B2

(12) United States Patent
Furuya et al.

(10) Patent No.: US 12,490,529 B2
(45) Date of Patent: Dec. 2, 2025

(54) SOLID-STATE IMAGING DEVICE AND ELECTRONIC APPARATUS HAVING A STORAGE CAPACITOR WITH A THIN INSULATING FILM

(71) Applicant: SONY SEMICONDUCTOR SOLUTIONS CORPORATION, Kanagawa (JP)

(72) Inventors: Shogo Furuya, Kanagawa (JP); Yorito Sakano, Kanagawa (JP); Ryo Takahashi, Kumamoto (JP); Atsushi Suzuki, Kumamoto (JP); Ryoichi Yoshikawa, Kumamoto (JP); Jun Suenaga, Kumamoto (JP); Shinichi Koga, Kumamoto (JP); Yohei Chiba, Kumamoto (JP); Tadamasa Shioyama, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 527 days.

(21) Appl. No.: 17/293,132

(22) PCT Filed: Nov. 19, 2019

(86) PCT No.: PCT/JP2019/045276
§ 371 (c)(1),
(2) Date: May 12, 2021

(87) PCT Pub. No.: WO2020/105634
PCT Pub. Date: May 28, 2020

(65) Prior Publication Data
US 2022/0013557 A1    Jan. 13, 2022

(30) Foreign Application Priority Data

Nov. 19, 2018  (JP) ................................. 2018-216342
Nov. 15, 2019  (JP) ................................. 2019-206785

(51) Int. Cl.
*H10F 39/00* (2025.01)
*H10F 39/18* (2025.01)

(52) U.S. Cl.
CPC ......... *H10F 39/8023* (2025.01); *H10F 39/18* (2025.01); *H10F 39/811* (2025.01);
(Continued)

(58) Field of Classification Search
CPC ......... H01L 27/14605; H01L 27/14636; H01L 27/14643; H01L 27/14621;
(Continued)

(56) References Cited

U.S. PATENT DOCUMENTS

2009/0290058 A1    11/2009  Miyagawa
2010/0108864 A1     5/2010  Ohta et al.
(Continued)

FOREIGN PATENT DOCUMENTS

CN    101728406 A    6/2010
CN    103258829 A    8/2013
(Continued)

OTHER PUBLICATIONS

International Search Report prepared by the Japan Patent Office on Feb. 4, 2020, for International Application No. PCT/JP2019/045276.

*Primary Examiner* — Norman D Richards
*Assistant Examiner* — Laura M Dykes
(74) *Attorney, Agent, or Firm* — Sheridan Ross PC

(57) ABSTRACT

There is provided a solid-state imaging device having a configuration suitable for high integration. The solid-state imaging device includes a semiconductor layer, a photoelectric converter, a storage capacitor, and a first transistor. The photoelectric converter is provided in the semiconductor layer, and generates an electric charge corresponding to a received light amount by photoelectric conversion. The
(Continued)

storage capacitor is provided on the semiconductor layer, and includes a first insulating film having a first electrical film thickness. The first transistor is provided on the semiconductor layer, and includes a second insulating film having a second electrical film thickness larger than the first electrical film thickness.

22 Claims, 29 Drawing Sheets

(52) U.S. Cl.
CPC ........ *H10F 39/014* (2025.01); *H10F 39/8053* (2025.01); *H10F 39/8057* (2025.01)
(58) Field of Classification Search
CPC ......... H01L 27/14623; H01L 27/14689; H01L 27/14612; H01L 27/14603; H04N 25/77
USPC .......................................................... 257/431
See application file for complete search history.

(56) References Cited

U.S. PATENT DOCUMENTS

| | | |
|---|---|---|
| 2013/0200479 A1 | 8/2013 | Sakano et al. |
| 2017/0069677 A1 | 3/2017 | Saruwatari et al. |
| 2018/0315786 A1* | 11/2018 | Hirase ...................... G02B 7/04 |
| 2021/0082977 A1* | 3/2021 | Hirase ............... H01L 27/14603 |

FOREIGN PATENT DOCUMENTS

| | | | | |
|---|---|---|---|---|
| CN | 106134182 A | | 11/2016 | |
| JP | 2000349259 A | * | 12/2000 | |
| JP | 2005-347655 | | 12/2005 | |
| JP | 2009-283552 | | 12/2009 | |
| JP | 2010-109136 | | 5/2010 | |
| JP | 2013-161868 | | 8/2013 | |
| KR | 20120067286 A | | 6/2012 | |
| WO | WO-2007139257 A1 | * | 12/2007 | ....... H01L 27/14603 |
| WO | WO 2015/068315 | | 5/2015 | |
| WO | WO 2015/152297 | | 10/2015 | |

* cited by examiner

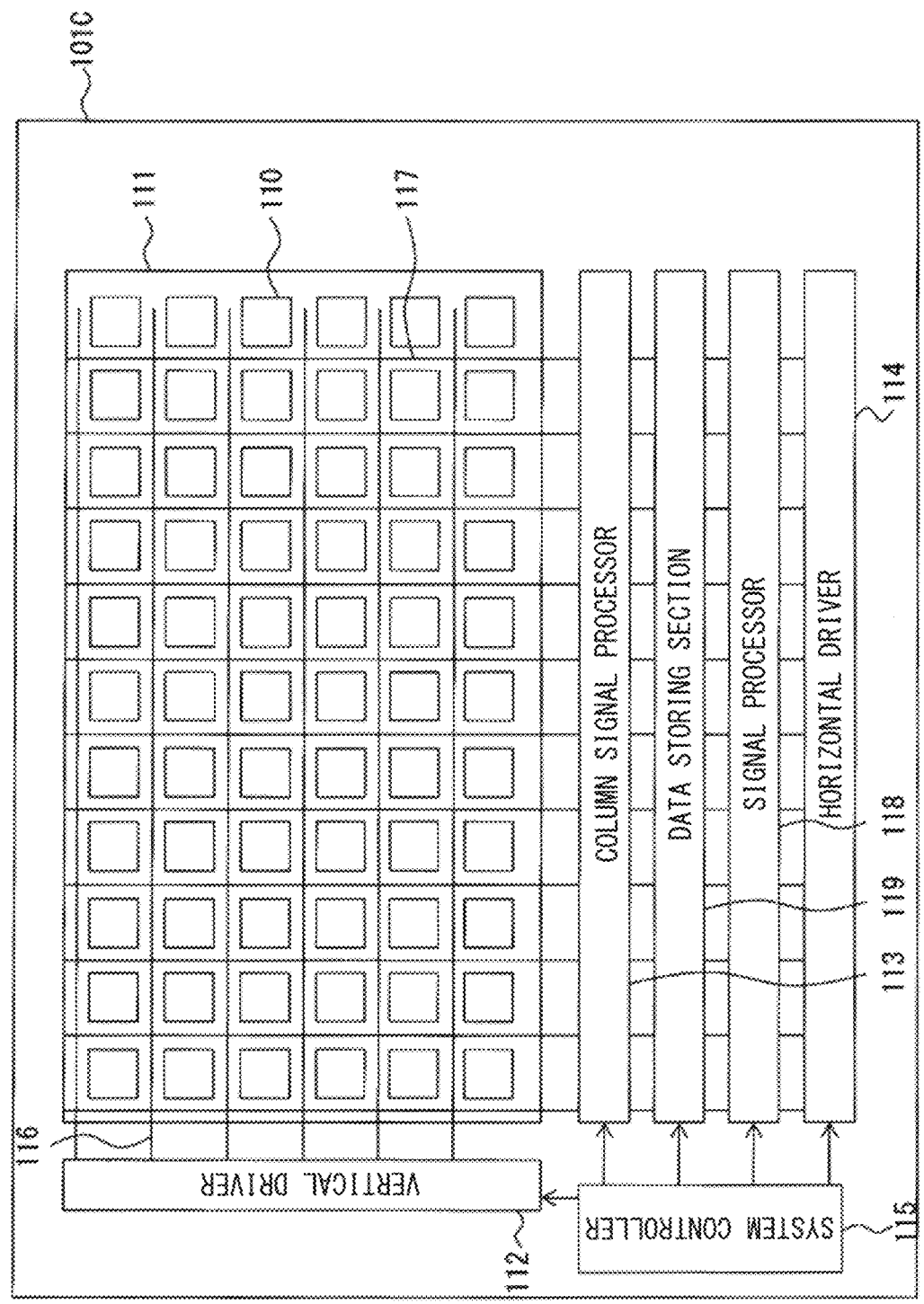

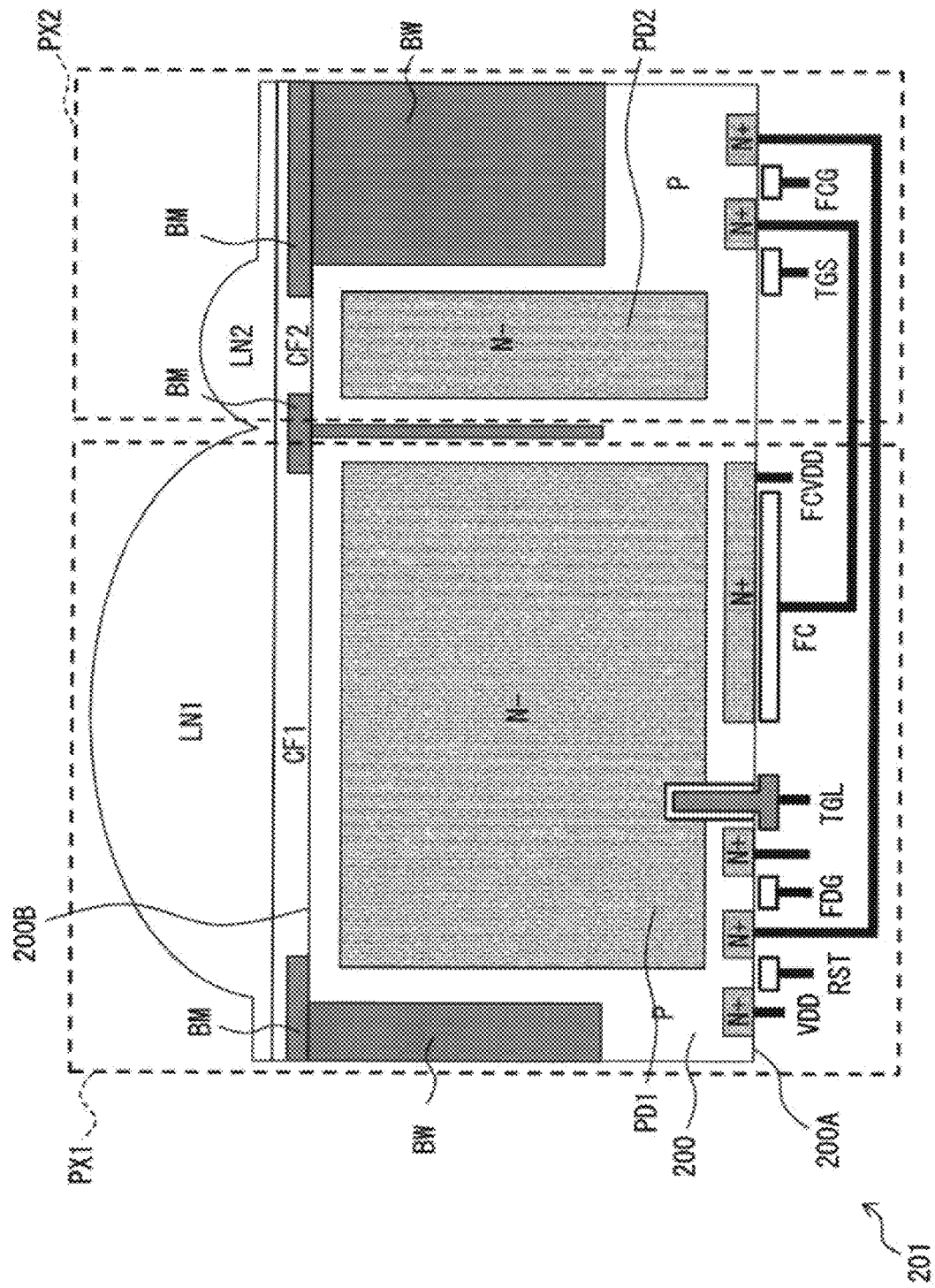

SOLID-STATE IMAGING DEVICE AND ELECTRONIC APPARATUS HAVING A STORAGE CAPACITOR WITH A THIN INSULATING FILM

CROSS REFERENCE TO RELATED APPLICATIONS

This application is a national stage application under 35 U.S.C. 371 and claims the benefit of PCT Application No. PCT/JP2019/045276 having an international filing date of 19 Nov. 2019, which designated the United States, which PCT application claimed the benefit of Japanese Patent Application Nos. 2018-216342, filed 19 Nov. 2018 and 2019-206785, filed 15 Nov. 2019, the entire disclosures of each of which are incorporated herein by reference.

TECHNICAL FIELD

The present disclosure relates to a solid-state imaging device that performs imaging by performing photoelectric conversion, and an electronic apparatus including the solid-state imaging device.

BACKGROUND ART

A solid-state imaging device has been proposed that temporarily stores, in a memory provided in a semiconductor layer, a signal electric charge generated by a photoelectric converter provided in the semiconductor layer (for example, see PTL 1).

CITATION LIST

Patent Literature

PTL 1: Japanese Unexamined Patent Application Publication No. 2005-347655

SUMMARY OF THE INVENTION

Incidentally, in such a solid-state imaging device, higher integration is desired while maintaining imaging performance.

It is therefore desirable to provide a solid-state imaging device having a configuration suitable for high integration, and an electronic apparatus including such an imaging device.

A solid-state imaging device as an embodiment of the present disclosure includes: a semiconductor layer; a photoelectric converter that is provided in the semiconductor layer, and generates an electric charge corresponding to a received light amount by photoelectric conversion; a storage capacitor that is provided on the semiconductor layer, and includes a first insulating film having a first electrical film thickness; and a first transistor that is provided on the semiconductor layer, and includes a second insulating film having a second electrical film thickness larger than the first electrical film thickness.

In addition, an electronic apparatus as an embodiment of the present disclosure includes the above-described imaging device.

In the imaging device and the electronic apparatus as the embodiments of the present disclosure, the above-described configuration makes it possible to thin the insulating film of the storage capacitor, thereby increasing a capacitance of the storage capacitor without expanding an area occupied by the storage capacitor.

BRIEF DESCRIPTION OF THE DRAWINGS

FIG. 1C is a block diagram illustrating a configuration example of a function of a solid-state imaging device as a second modification example.

FIG. 21A is a cross-sectional view of a configuration example of a main part of a solid-state imaging device as a third modification example.

MODES FOR CARRYING OUT THE INVENTION

Figure 1A:
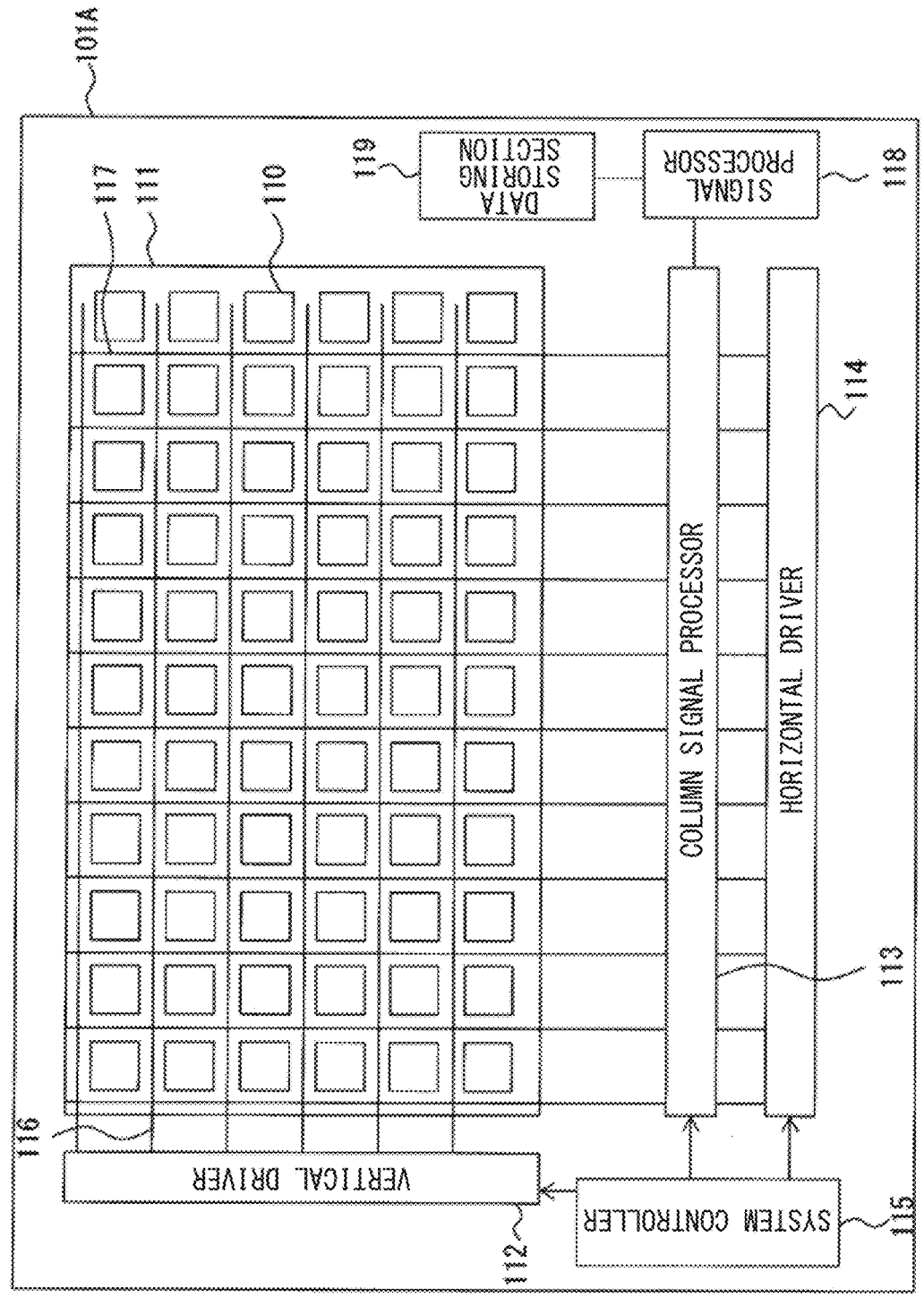
FIG. 1A is a block diagram illustrating a configuration example of a function of a solid-state imaging device according to a first embodiment of the present disclosure.

Embodiments of the present disclosure are described in detail below with reference to the drawings. It is to be noted that description is given in the following order.
1. First Embodiment
An example of a solid-state imaging device in which an electrical film thickness of a first insulating film in a storage capacitor coupled to an electric charge-voltage converter is smaller than an electrical film thickness of a gate insulating film of a transfer transistor
2. Second Embodiment
An example of a solid-state imaging device in which the electrical film thickness of the first insulating film in the storage capacitor as an electric charge holding section is smaller than the electrical film thickness of the gate insulating film of the transfer transistor
3. Third Embodiment
An example of a solid-state imaging device in which the electrical film thickness of the first insulating film in the storage capacitor coupled to the electric charge-voltage converter through a switching section is smaller than the electrical film thickness of the gate insulating film of the transfer transistor
4. Fourth Embodiment
An example of a solid-state imaging device in which an electrical film thickness of a gate insulating film of an amplification transistor is smaller than the electrical film thickness of the gate insulating film of the transfer transistor
5. Fifth Embodiment
An example of a solid-state imaging device in which a storage capacitor is stacked at a position overlapping a photoelectric converter
6. Sixth Embodiment
An example of a solid-state imaging device that includes, as a transfer transistor, a vertical transistor including a plug
7. Seventh Embodiment
An example of a solid-state imaging device in which the storage capacitor is a planar type n-type MOS capacitor
8. Eighth Embodiment
An Example of a solid-state imaging device in which the storage capacitor is a trench type MOS capacitor including a recessed and projected structure
9. Ninth Embodiment
An example of a solid-state imaging device that further includes an adjacent pixel including no storage capacitor
10. Tenth Embodiment
An example of a solid-state imaging device in which the storage capacitor is provided over both respective photoelectric converters of two pixels
11. Application Example to Electronic Apparatus
12. Application Example to Mobile Body
13. Other Modification Examples

1. FIRST EMBODIMENT

[Configuration of Solid-State Imaging Device 101]
FIG. 1 is a block diagram illustrating a configuration example of a function of a solid-state imaging device 101A according to a first embodiment of the present technology.

The solid-state imaging device 101A is, for example, a CMOS (Complementary Metal Oxide Semiconductor) image sensor. The solid-state imaging device 101A captures an image by receiving light from a subject and performing photoelectric conversion to generate an image signal.

The solid-state imaging device 101A includes, for example, a pixel array section 111, a vertical driver 112, a column signal processor 113, a data storing section 119, a horizontal driver 114, a system controller 115, and a signal processor 118.

In the solid-state imaging device 101A, the pixel array section 111 is formed on a semiconductor layer 11 (to be described later). Peripheral circuits such as the vertical driver 112, the column signal processor 113, the data storing section 119, the horizontal driver 114, the system controller 115, and the signal processor 118 are formed, for example, on the same semiconductor layer 11 where the pixel array section 111 is formed.

The pixel array section 111 includes a plurality of sensor pixels 110 that each include a photoelectric converter 51 (to be described later). The photoelectric converter 51 generates an electric charge corresponding to an amount of light received from the subject and stores the electric charge. The sensor pixels 110 are arranged in each of a horizontal direction (a row direction) and a vertical direction (a column direction) as illustrated in FIG. 1. In the pixel array section 111, a pixel driving line 116 is wired along the row direction with each pixel row including the sensor pixels 110 arranged in one line in the row direction, and a vertical signal line (VSL) 117 is wired along the column direction with each pixel column including the sensor pixels 110 arranged in one line in the column direction.

The vertical driver 112 includes a shift register, an address decoder, and the like. The vertical driver 112 supplies a signal or the like to each of the plurality of sensor pixels 110 through a plurality of pixel driving lines 116 to drive all the plurality of sensor pixels 110 in the pixel array section 111 simultaneously or to drive the plurality of sensor pixels 110 in pixel row units.

The vertical driver 112 includes, for example, two scanning systems, that is, a read scanning system and a sweep scanning system. The read scanning system sequentially performs selective scanning on unit pixels of the pixel array section 111 in units of one row to read signals from the unit pixels. The sweep scanning system performs sweep scanning on a read row that is to be subjected to read scanning by the read scanning system, ahead of the read scanning by a time for shutter speed.

Unnecessary electric charges from photoelectric converters 51 in the unit pixels in the read row are swept through the sweep scanning by the sweep scanning system. This is referred to as "resetting". A so-called electronic shutter operation is then performed by sweeping the unnecessary electric charges by the sweep scanning system, that is, by resetting. Here, the electronic shutter operation represents an operation to discard photoelectric charges in the photoelectric converters 51 and newly start light exposure, that is, start storing photoelectric charges.

A signal to be read by a reading operation by the read scanning system corresponds to an amount of light received after an immediately preceding reading operation or the electronic shutter operation. A period from a timing of reading by the immediately preceding reading operation or a timing of sweeping by the electronic shutter operation to a timing of reading by the reading operation this time is a photoelectric charge storing time, that is, a light exposure time in the unit pixels.

The signals outputted from the respective unit pixels in the pixel row selectively scanned by the vertical driver 112 are supplied to the column signal processor 113 through the respective vertical signal lines 117. The column signal processor 113 performs predetermined signal processing on the signals outputted from the respective unit pixels in the selected row through the vertical signal lines 117 for each pixel column of the pixel array section 111, and temporarily holds pixel signals having been subjected to the signal processing.

Specifically, the column signal processor 113 includes, for example, a shift register, an address decoder, and the like, and performs noise removal processing, correlated double sampling, A/D (Analog/Digital) conversion A/D conversion processing on an analog pixel signal, and the like to generate a digital pixel signal. The column signal processor 113 supplies the generated pixel signal to the signal processor 118.

The horizontal driver 114 includes, for example, a shift register, an address decoder, and the like, and sequentially selects unit circuits corresponding to pixel columns of the column signal processor 113. Through selective scanning by this horizontal driver 114, pixel signals having been subjected to signal processing for each unit circuit by the column signal processor 113 are sequentially outputted to the signal processor 118.

The system controller 115 includes, for example, a timing generator that generates various timing signals. The system controller 115 performs drive control on the vertical driver 112, the column signal processor 113, and the horizontal driver 114 on the basis of the timing signals generated by the timing generator.

The signal processor 118 performs signal processing such as arithmetic processing on the pixel signals supplied from the column signal processor 113 while temporarily storing data in the data storing section 119 as necessary, and outputs an image signal including the respective pixel signals.

For the signal processing by the signal processor 118, the data storing section 119 temporarily stores data necessary for the signal processing.

Figure 1B:
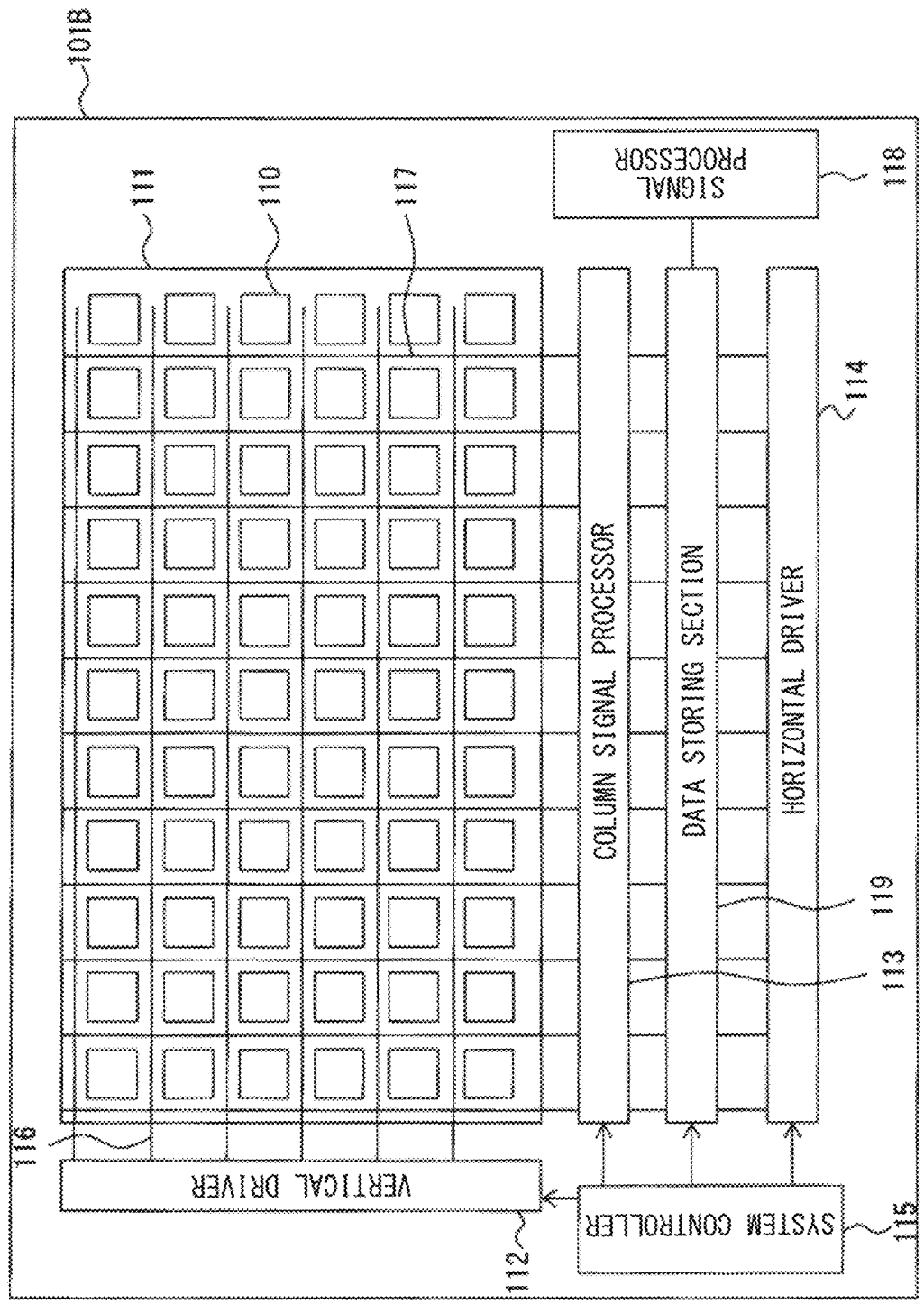
FIG. 1B is a block diagram illustrating a configuration example of a function of a solid-state imaging device as a first modification example.

It is to be noted that a solid-state imaging device of the present technology is not limited to the solid-state imaging device 101A illustrated in FIG. 1A, and may have, for example, a configuration such as a solid-state imaging device 101B illustrated in FIG. 1B or a solid-state imaging device 101C illustrated in FIG. 1C. FIG. 1B is a block diagram illustrating a configuration example of a function of the solid-state imaging device 101B as a first modification example according to the first embodiment of the present technology. FIG. 1C is a block diagram illustrating a configuration example of a function of the solid-state imaging device 101C as a second modification example according to the first embodiment of the present technology.

In the solid-state imaging device 101B in FIG. 1B, the data storing section 119 is disposed between the column signal processor 113 and the horizontal driver 114, and pixel signals outputted from the column signal processor 113 are supplied to the signal processor 118 through the data storing section 119.

In addition, in the solid-state imaging device 101C in FIG. 1C, the data storing section 119 and the signal processor 118 are disposed side by side between the column signal processor 113 and the horizontal driver 114. In the solid-state imaging device 101C, the column signal processor 113 performs A/D conversion to convert analog pixel signals into digital pixel signals in units of one column of the pixel array section 111 or in units of a plurality of columns of the pixel array section 111.

[Configuration of Sensor Pixel 110]
(Circuit Configuration Example)

Figure 2:
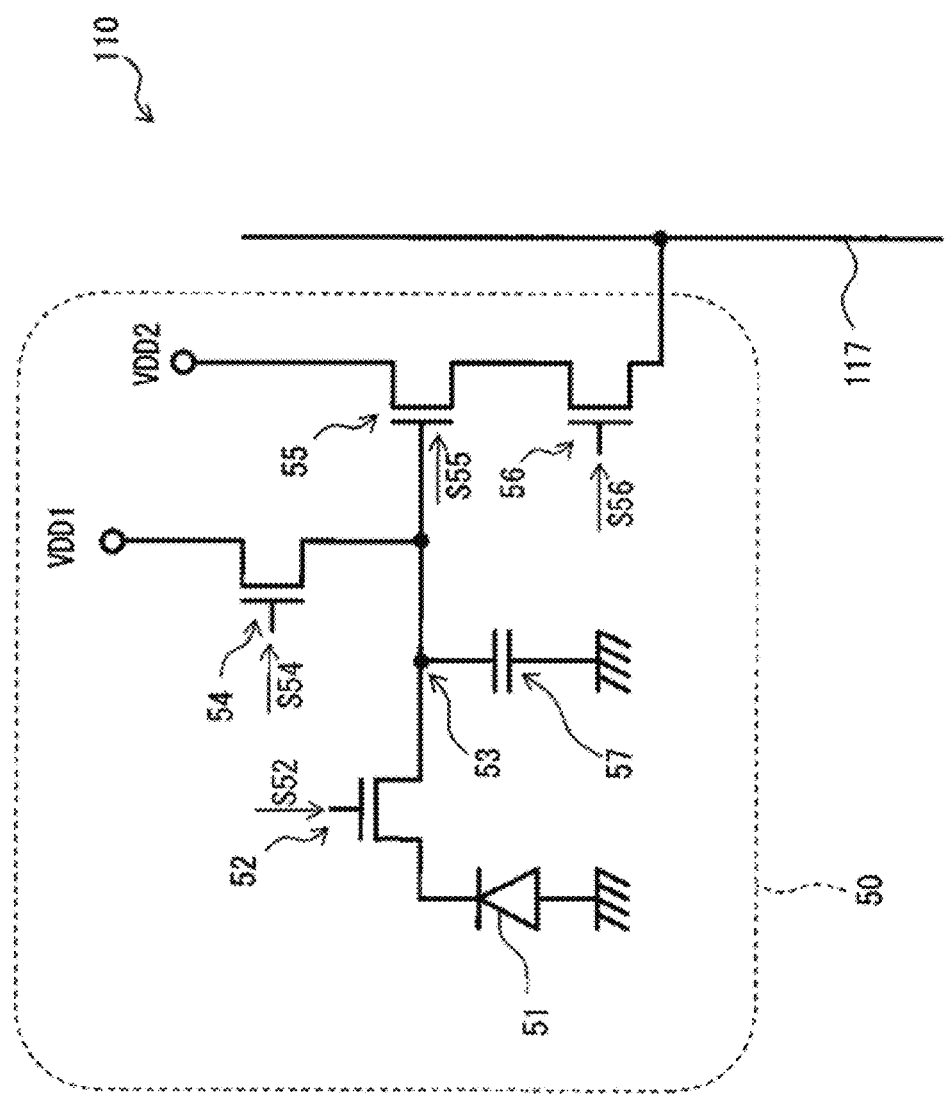
FIG. 2 is a circuit diagram illustrating a circuit configuration example of one sensor pixel in the solid-state imaging device illustrated in FIG. 1A.

Next, description is given of a circuit configuration example of the sensor pixel 110 provided in the pixel array section 111 in FIG. 1A with reference to FIG. 2. FIG. 2 illustrates a circuit configuration example of a pixel circuit 50 in one sensor pixel 110 of the plurality of sensor pixels 110 included in the pixel array section 111.

In the example illustrated in FIG. 2, the pixel circuit 50 includes the photoelectric converter (PD) 51, a transfer transistor (TG) 52, an electric charge-voltage converter (FD) 53, a reset transistor (RST) 54, an amplification transistor (AMP) 55, a selection transistor (SEL) 56, and a storage capacitor (CP) 57.

In this example, each of the TG 52, the RST 54, the AMP 55, and the SEL 56 is an N-type MOS transistor. Drive signals S52, S54, S55, and S56 are respectively supplied to respective gate electrodes of the TG 52, the RST 54, the AMP 55, and the SEL 56 by the vertical driver 112 and the horizontal driver 114 on the basis of drive control by the system controller 115. Each of the drive signals S52, S54, S55, and S56 is a pulse signal in which a high level state is an active state (an on state) and a low level state is an inactive state (an off state). It is to be noted that in the following, turning a drive signal to the active state is also referred to as "turning on a drive signal", and turning a drive signal to the inactive state is also referred to as "turning off a drive signal".

The PD 51 includes, for example, a photoelectric conversion element including PN junction photodiode, and receives light from a subject, generates an electric charge corresponding to an amount of the received light by photoelectric conversion, and stores the electric charge.

The TG 52 is coupled between the PD 51 and the FD 53, and is configured to transfer the electric charge stored in the PD 51 to the FD 53 in accordance with the drive signal S52 applied to the gate electrode of the TG 52. The TG 52 is a specific example corresponding to each of a "first transistor" and a "transfer transistor" in the present disclosure.

The RST 54 has, for example, a drain coupled to a power source VDD1 and a source coupled to the FD 53. The RST 54 initializes, that is, resets the FD 53 in accordance with the drive signal S54 applied to the gate electrode thereof. For example, in a case where the drive signal S54 is turned on to turn on the RST 54, a potential of the FD 53 is reset to a voltage level of the power source VDD1. That is, the FD 53 is initialized.

The FD 53 is a transfer destination of the electric charge generated in the PD 51, and is a floating diffusion region that converts the electric charge transferred from the PD 51 through the TG 52 into an electric signal (for example, a voltage signal) and outputs the electric signal. The FD 53 is coupled to the RST 54, and is coupled to the VSL 117 through the AMP 55 and the SEL 56. The FD 53 is further coupled to the CP 57 through a wiring line W57 including metal or the like (see FIG. 3 and FIG. 4 to be described later). The CP 57 is a storage capacitor that stores the electric charge generated in the PD 51 and transferred from the PD 51 together with the FD 53.

The AMP 55 has, for example, a gate coupled to the FD 53, a drain coupled to a power source VDD2, and a source coupled to the SEL 56. The AMP 55 outputs an electric signal corresponding to the potential of the FD 53. The SEL 56 has, for example, a drain coupled to the AMP 55 and a source coupled to the VSL 117. The SEL 56 is turned on when the corresponding sensor pixel 110 is selected, and outputs the electric signal having passed through the AMP 55 from the FD 53 to the column signal processor 113 through the VSL 117.

(Planar Configuration Example and Cross-Sectional Configuration Example)

Figure 3:
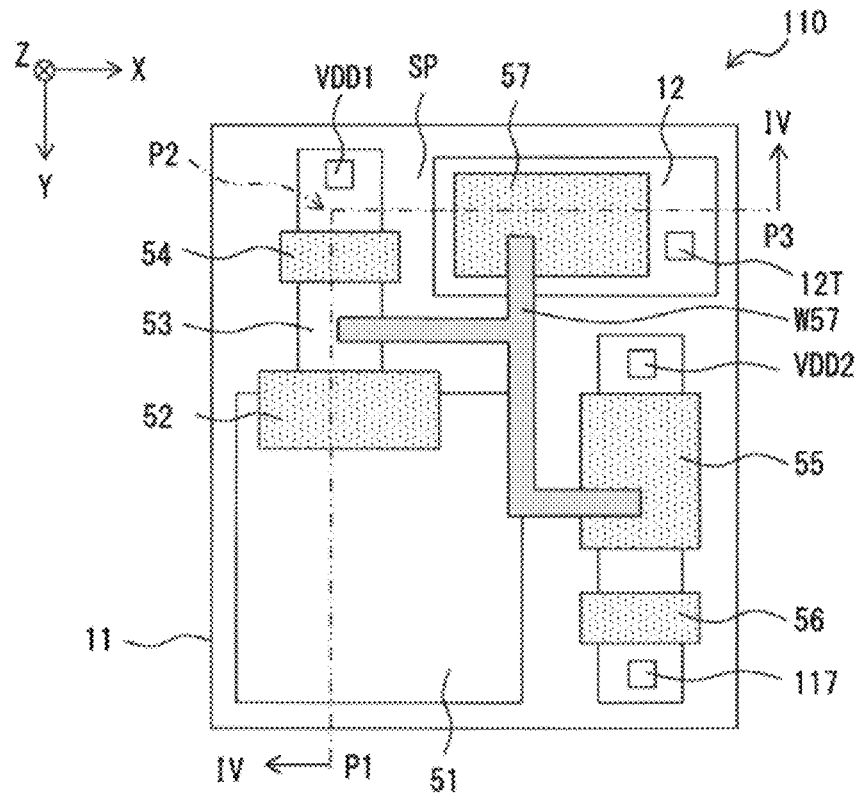
FIG. 3 is a plan view of a planar configuration example of the sensor pixel illustrated in FIG. 2.
Figure 4:
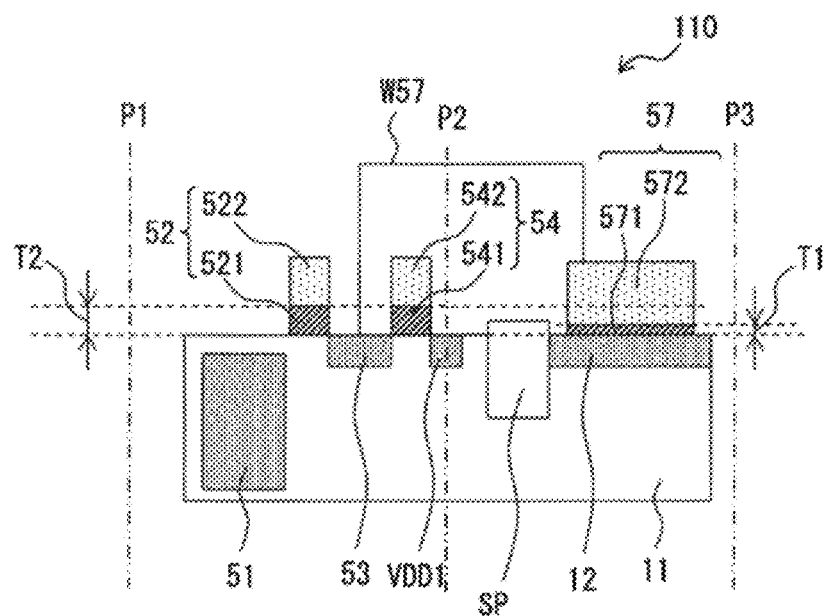
FIG. 4 is a cross-sectional view of a cross-sectional configuration example of the sensor pixel illustrated in FIG. 2.

Next, description is given of a planar configuration example and a cross-sectional configuration example of the sensor pixel 110 provided in the pixel array section 111 in FIG. 1A. FIG. 3 illustrates a planar configuration example of one sensor pixel 110 of the plurality of sensor pixels 110 included in the pixel array section 111. In addition, FIG. 4 illustrates a cross-sectional configuration example of the one sensor pixel 110, and corresponds to a cross section taken along a cut line IV-IV illustrated in FIG. 3 as viewed from the direction of an arrow. Note that in FIG. 4, a portion from a position P1 to a position P2 illustrates an YZ cross section along a Y-axis direction, and a portion from the position P2 to a position P3 illustrates an XZ cross section along an X-axis direction.

In the example of the sensor pixel 110 illustrated in FIG. 3, the PD 51 occupies a major region of the sensor pixel 110, and the FD 53, the RST 54, the AMP 55, the SEL 56, the CP 57, the power source VDD1, the power source VDD2, and the VSL 117 are provided in a region around the major region. The TG 52 is provided at a position partially overlapping the PD 51 in a Z-axis direction (also referred to as a thickness direction or a depth direction).

As illustrated in FIG. 3 and FIG. 4, the sensor pixel 110 includes a semiconductor layer 11 formed using a semiconductor material such as Si (silicon), the PD 51 provided inside the semiconductor layer 11, and the TG 52 as a transfer section provided on the semiconductor layer 11. The TG 52 includes, on the semiconductor layer 11, a stacked structure in which a gate insulating film 521 including silicon oxide or the like and a gate electrode layer 522 are stacked in order. Similarly, the RST 54 includes, on the semiconductor layer 11, a stacked structure in which a gate insulating film 541 including silicon oxide or the like and a gate electrode layer 542 are stacked in order. The FD 53 is provided between the TG 52 and the RST 54 in an uppermost portion of the semiconductor layer 11. The CP 57 includes an insulating film 571 stacked on an impurity diffusion layer 12 provided in the uppermost portion of the semiconductor layer 11, and a metal layer 572 stacked on the insulating film 571. The FD 53 is coupled to the metal layer 572 of the CP 57 through a wiring line W57. A device separation section SP is provided between the RST 54 and the CP 57. It is to be noted that in the following, description of the device separation section SP is omitted. A contact layer 12T (see FIG. 3) is provided in the impurity diffusion layer 12.

Here, the insulating film 571 of the CP 57 has a film thickness ET1 as a first electrical film thickness and a film thickness T1 as a first physical film thickness. In contrast, each of the gate insulating film 521 of the TG 52 and the gate insulating film 541 of the RST 54 has a film thickness ET2 as a second electrical film thickness and a film thickness T2 as a second physical film thickness. The film thickness ET2 is larger than the film thickness ET1 (ET1<ET2). In addition, the film thickness T2 may be larger than the film thickness T1 (T1<T2). That is, the insulating film 571 has a first dielectric strength voltage, and the gate insulating films 521 and 541 have a second dielectric strength voltage higher than the first dielectric strength voltage. It is to be noted that the insulating film 571 is a specific example corresponding to a "first insulating film" in the present disclosure, and the gate insulating films 521 and 541 are specific examples corresponding to a "second insulating film" in the present disclosure. In addition, each of gate insulating films of the AMP 55 and the SEL 56 has, for example, the film thickness ET2 larger than the film thickness ET1, and the film thickness T2 larger than the film thickness T1.

An electrical film thickness is a parameter proportional to a value (a physical film thickness/a dielectric constant) obtained by dividing a physical film thickness of a given film by a dielectric constant of the given film, and an EOT (equivalent oxide thickness) representing a film thickness of $SiO_2$ that would give an equivalent capacitance is one specific example of the parameter.

In addition, the insulating film 571 of the CP 57, the gate insulating film 521 of the TG 52, and the gate insulating film 541 of the RST 54 may each include a material of the same kind, that is, a material having the same dielectric constant. However, the dielectric constant of the insulating film 571 of the CP 57 is desirably higher than the dielectric constant of the gate insulating film 521 of the TG 52 and the dielectric constant of the gate insulating film 541 of the RST 54. This makes it possible to further increase a storage capacitance of the CP 57, that is, a saturated electric charge amount per area occupied by a unit pixel.

(Operation of Sensor Pixel 110)

Next, description is given of an operation of the sensor pixel 110 with reference to FIGS. 2 to 4. In the sensor pixel 110, in reading an electric charge generated and stored in the PD 51 that has received light from a subject, the drive signal S52 to the TG 52 is turned on, on the basis of drive control by the system controller 115. This causes the electric charge stored in the PD 51 to be transferred from the PD 51 to the FD 53 through the TG 52. After the electric charge is transferred to the FD 53, the FD 53 converts the electric charge into an electric signal having a level corresponding to each electric charge. Thereafter, the SEL 56 is turned on by the drive signal S56, which causes the electric signal from the FD 53 to sequentially pass through the AMP 55 and the SEL 56 and be outputted to the column signal processor 113 through the VSL 117.

(Method of Manufacturing Sensor Pixel 110)

Next, description is given of a method of manufacturing the solid-state imaging device 101A with reference to FIGS. 5A to 5G. Each of FIGS. 5A to 5F is a cross-sectional view of one process in the method of manufacturing the solid-state imaging device 101A, and is a cross-sectional view corresponding to FIG. 4.

Figure 5A:
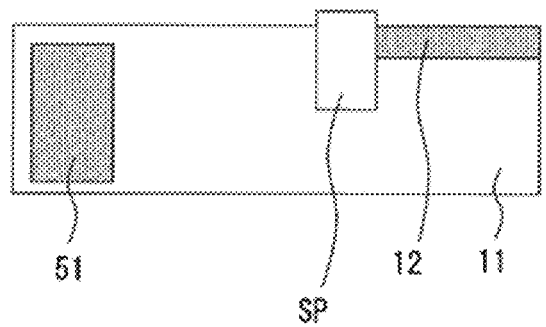
FIG. 5A is a cross-sectional view of one process in a method of manufacturing the sensor pixel illustrated in FIG. 2.

First, as illustrated in FIG. 5A, the semiconductor layer 11 in which the PD 51 is embedded is prepared, and the impurity diffusion layer 12 is formed at a predetermined position in an uppermost layer of the semiconductor layer 11 by ion implantation.

Figure 5B:
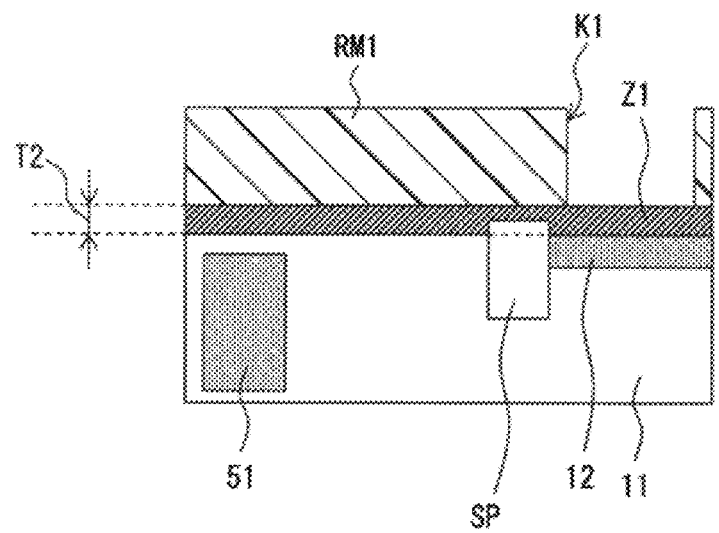
FIG. 5B is a cross-sectional view of one process subsequent to FIG. 5A.

Next, as illustrated in FIG. 5B, an insulating material is deposited by, for example, a thermal oxidation method or a sputtering method to cover the entire surface of the semiconductor layer 11, thereby forming an insulating film Z1. At this time, the insulating film Z1 is adjusted to have a predetermined thickness T2. Thereafter, a resist mask RM1 having an opening K1 at a position overlapping a partial region of the impurity diffusion layer 12 is formed on the insulating film Z1.

Figure 5C:
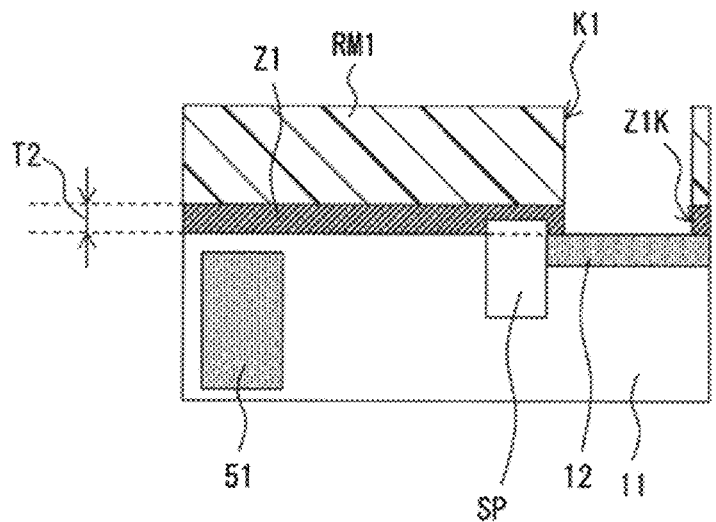
FIG. 5C is a cross-sectional view of one process subsequent to FIG. 5B.

Subsequently, as illustrated in FIG. 5C, a portion not covered by the resist mask RM1 of the insulating film Z1 is selectively removed to form an opening Z1K to expose a portion of the impurity diffusion layer 12.

Figure 5D:
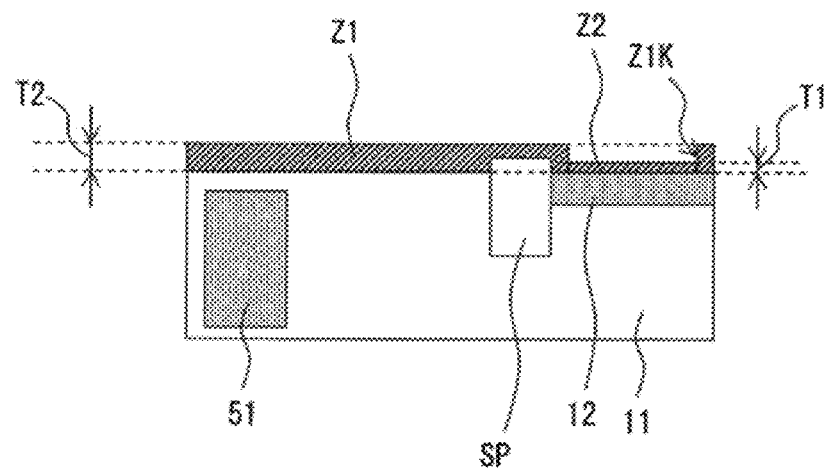
FIG. 5D is a cross-sectional view of one process subsequent to FIG. 5C.

Thereafter, as illustrated in FIG. 5D, the resist mask RM1 is removed, and then an insulating film Z2 is selectively formed to fill in the opening Z1K. The insulating film Z2 is obtained by depositing an insulating material by, for example, a thermal oxidation method, a sputtering method, or the like. At this time, the insulating film Z2 is adjusted to have a predetermined thickness T1.

Figure 5E:
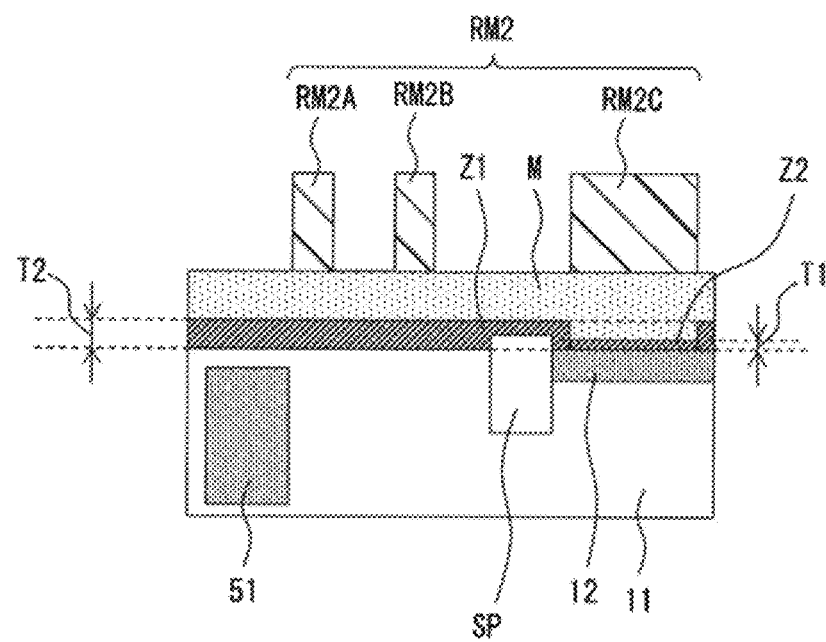
FIG. 5E is a cross-sectional view of one process subsequent to FIG. 5D.

Next, as illustrated in FIG. 5E, a gate electrode material film M is formed to cover the insulating film Z1 and the insulating film Z2. Furthermore, a resist mask RM2 that selectively covers the gate electrode material film M is formed. The resist mask RM2 includes portions RM2A to RM2C. Here, the portion RM2A is formed in a region where the TG 52 is to be formed. The portion RM2A is formed in a region where the RST 54 is to be formed. The portion RM2C is formed in a region where the CP 57 is to be formed.

Figure 5F:
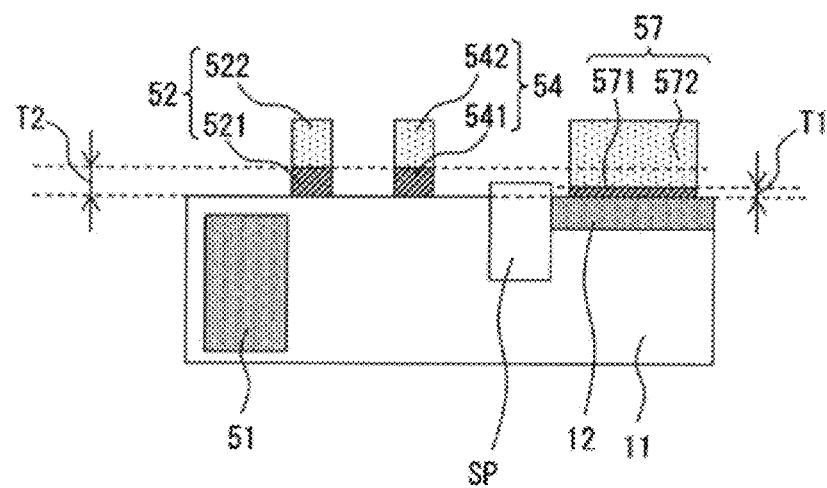
FIG. 5F is a cross-sectional view of one process subsequent to FIG. 5E.

Thereafter, a portion not covered by the resist mask RM2 of the gate electrode material film M is selectively removed, and then the resist mask RM2 is removed. As a result, as illustrated in FIG. 5F, each of the TG 52 in which the gate insulating film 521 and the gate electrode layer 522 are stacked in order, the RST 54 in which the gate insulating film 541 and the gate electrode layer 542 are stacked in order, and the CP 57 in which the insulating film 571 and the metal layer 572 are stacked in order on the impurity diffusion layer 12 is obtained on the semiconductor layer 11.

Figure 5G:
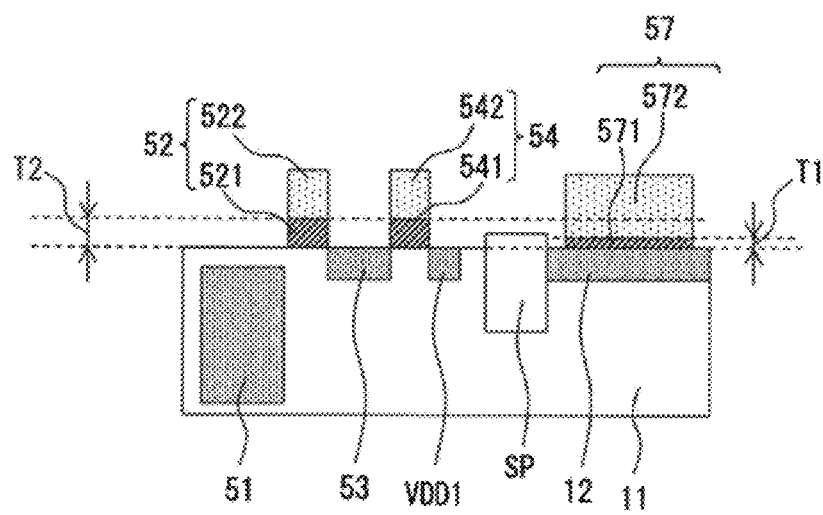
FIG. 5G is a cross-sectional view of one process subsequent to FIG. 5F.

Thereafter, the FD 53, the power source VDD1, and the like are formed at predetermined positions in the uppermost layer of the semiconductor layer 11 with use of a method such as photolithography and ion implantation as illustrated in FIG. 5G. It is to be noted that in FIGS. 5A to 5G, the AMP 55 and the SEL 56 are not illustrated; however, the AMP 55 and the SEL 56 may be formed simultaneously with the TG 52 and the RST 54 by a method similar to the method of forming the TG 52 and the RST 54.

Finally, manufacturing of the solid-state imaging device 101A is completed after formation of the wiring line W57 and the like.

[Effects of Solid-state Imaging Device 101A]

As described above, in the solid-state imaging device 101A according to the present embodiment, in each of the sensor pixels 110, the film thickness T1 (the film thickness ET1) of the insulating film 571 of the CP 57 is smaller than film thicknesses T2 (the film thicknesses ET2) of respective transistors included in the pixel circuit 50, for example, the gate insulating film 521 of the TG 52 and the gate insulating film 541 of the RST 54. This makes it possible to enhance the saturated electric charge amount of the CP 57 in each of the sensor pixels 110 without increasing an area occupied by the CP 57 in the solid-state imaging device 101A. That is, the saturated electric charge amount per unit area of the CP 57 in each of the sensor pixels 110 is increased. This makes it possible to increase, for example, area occupancy of the PD 51 in each of the sensor pixels 110 in the solid-state imaging device 101A, which makes it possible to achieve high integration of the sensor pixels 110.

In addition, in the solid-state imaging device 101A according to the present embodiment, the film thickness T2 (the film thickness ET2) of the gate insulating film 521 of the TG 52 is larger than the film thickness T1 (the film thickness ET1) of the insulating film 571 of the CP 57, which makes it possible to apply a higher voltage to the TG 52, and more rapidly transfer the electric charge from the PD 51 to the FD 53.

2. SECOND EMBODIMENT

[Configuration of Sensor Pixel 210]

Figure 6:
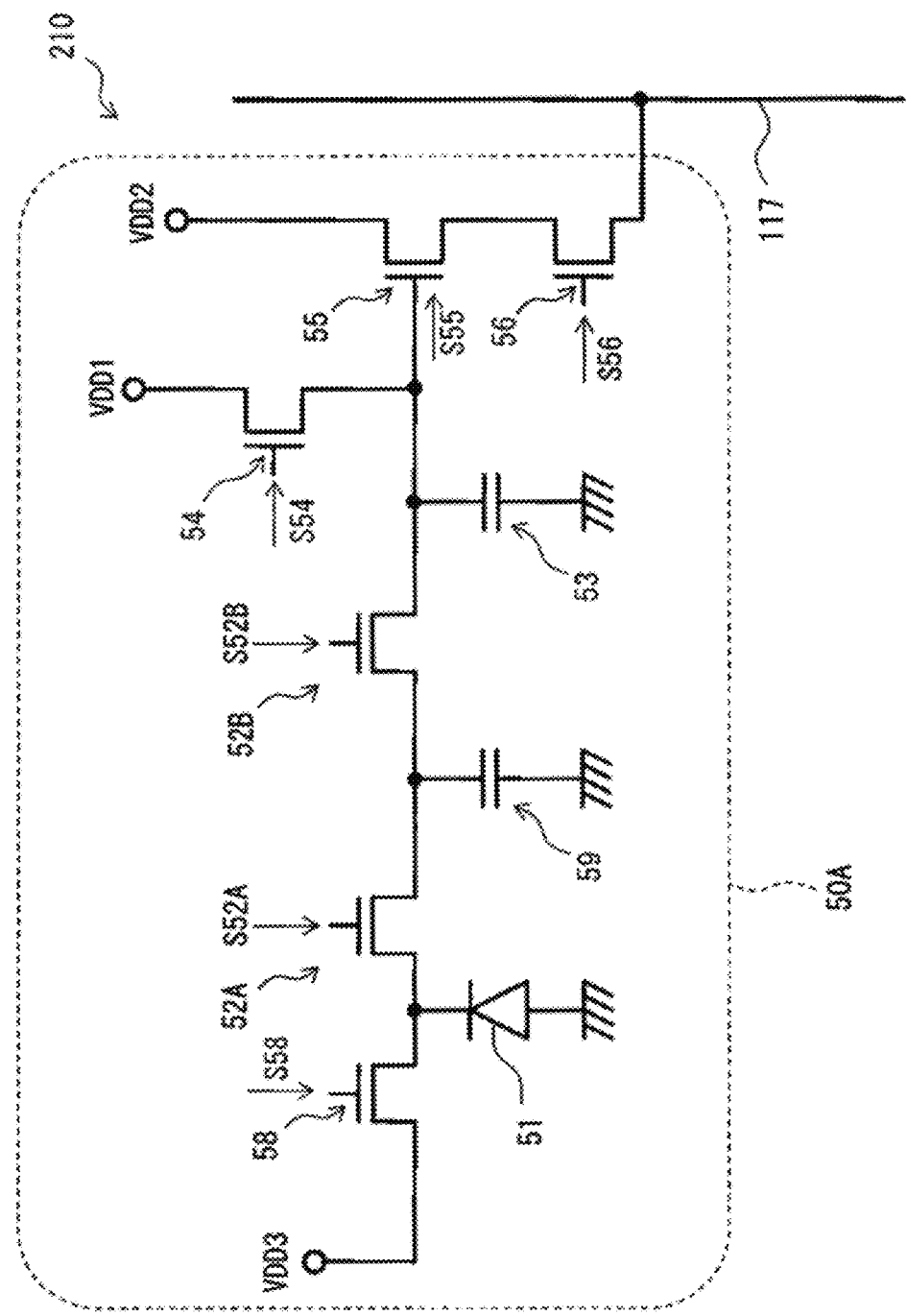
FIG. 6 is a circuit diagram illustrating a circuit configuration example of one sensor pixel in a solid-state imaging device according to a second embodiment of the present disclosure.
Figure 7:
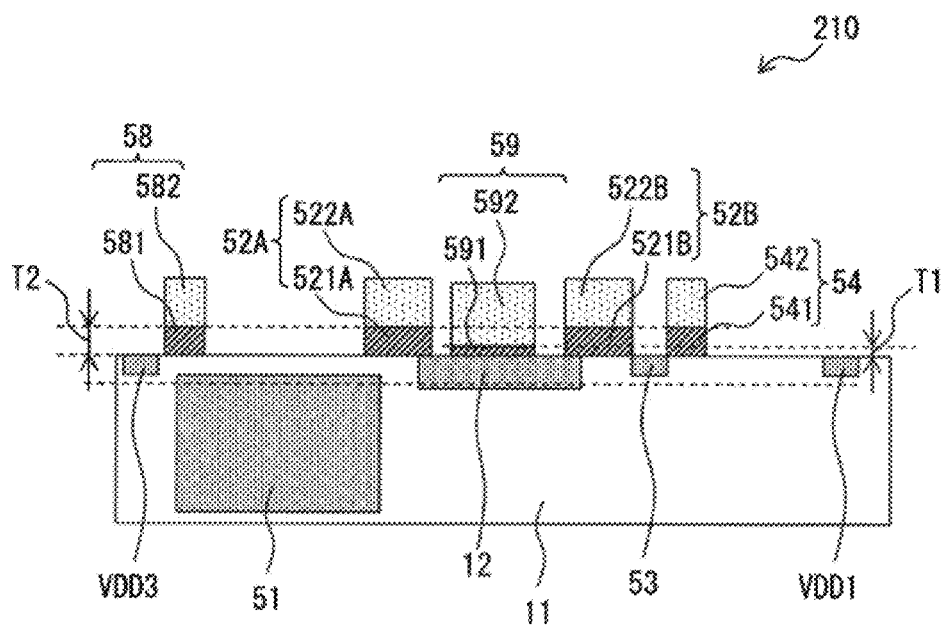
FIG. 7 is an explanatory diagram illustrating a cross-sectional configuration example of a portion of the sensor pixel illustrated in FIG. 6.

FIG. 6 illustrates a circuit configuration example of a pixel circuit 50A in a sensor pixel 210 according to a second embodiment of the present technology. In addition, FIG. 7 illustrates a cross-sectional configuration example of the sensor pixel 210.

As illustrated in FIG. 6, instead of the sensor pixel 110 according to the above-described first embodiment, the sensor pixel 210 is included in the solid-state imaging device 101A, and implements a so-called global shutter system image sensor.

The global shutter system is a system in which, basically, exposure of all pixels to light simultaneously starts and the exposure of all the pixels to light simultaneously ends. Here, all the pixels refer to all pixels in a portion appearing in an image, excluding a dummy pixel and the like. In addition, in a case where a time difference and distortion of an image are insignificantly small, the global shutter system includes a system in which global exposure is performed per unit of a plurality of rows (e.g., several ten rows) instead of being simultaneously performed on all the pixels, while shifting a region to be subjected to the global exposure. In addition, the global shutter system also includes a system in which the global exposure is performed on not all pixels in the portion appearing in the image but on pixels in a predetermined region.

In the example illustrated in FIG. 6, the pixel circuit 50A differs from the pixel circuit 50 in that instead of the CP 57, an electric charge holding section (MEM) 59 is further included between the PD 51 and the FD 53. Furthermore, the pixel circuit 50A differs from the pixel circuit 50 in that instead of the TG 52, a first transfer transistor (TG) 52A and a second transfer transistor (TG) 52B are included. The TG 52A is disposed between the PD 51 and the MEM 59, and the TG 52B is disposed between the MEM 59 and the FD 53. The pixel circuit 50A further includes a power source VDD3 as a transfer destination of the electric charge generated in the PD 51, and includes a discharge transistor (OFG) 58 between the PD 51 and the power source VDD3. The pixel circuit 50A has substantially the same configuration as that of the pixel circuit 50 as the above-described first embodiment, other than these points.

As illustrated in FIG. 7, in the sensor pixel 210, for example, the power source VDD3, the impurity diffusion layer 12, the FD 53, the power source VDD1, and the like are formed in the uppermost layer of the semiconductor layer 11. The OFG 58, the TG 52A, the MEM 59, the TG 52B, the RST 54, and the like are formed on the semiconductor layer 11.

The OFG 58 has a drain coupled to the power source VDD3 and a source coupled to a wiring line that is connected between the TG 52 and the PD 51. The OFG 58 includes, on the semiconductor layer 11, a stacked structure in which a gate insulating film 581 including silicon oxide or the like and a gate electrode layer 582 are stacked in order. The OFG 58 initializes, that is, resets the PD 51 in accordance with a drive signal S58 applied to the gate electrode layer 582. Resetting the PD 51 means depleting the PD 51.

In addition, the OFG 58 forms an overflow path between the TG 52 and the power source VDD3, and discharges an electric charge overflowing from the PD 51 to the power source VDD3. Thus, in the sensor pixel 210 according to the present embodiment, it is possible to implement an FD-holding type global shutter in which the OFG 58 is able to directly reset the PD 51.

The MEM 59 is provided between the PD 51 and the FD 53, and is a region that temporarily holds the electric charge generated and stored in the PD 51 until the electric charge is transferred to FD 53 for implementing a global shutter function. The MEM 59 includes, on the semiconductor layer 11, a stacked structure in which an insulating film 591 including silicon oxide or the like and a gate electrode layer 592 including polysilicon or the like are stacked in order.

The TG 52A is disposed between the PD 51 and the MEM 59, and the TG 52B is disposed between the MEM 59 and the FD 53. The TG 52A includes, on the semiconductor layer 11, a stacked structure in which a gate insulating film 521A including silicon oxide or the like and a gate electrode layer 522A are stacked in order. The TG 52A is configured to transfer the electric charge stored in the PD 51 to the MEM 59 in accordance with a drive signal S52A applied to the gate electrode layer 522A. The TG 52B includes, on the semiconductor layer 11, a stacked structure in which a gate insulating film 521B including silicon oxide or the like and a gate electrode layer 522B are stacked in order. The TG 52B is configured to transfer an electric charge temporarily held in the MEM 59 to the FD 53 in accordance with a drive signal S52B applied to the gate electrode layer 522B. In the sensor pixel 210, for example, in a case where the drive signal S52A is turned off to turn off the TG 52A and the drive signal S52B is turned on to turn on the TG 52B, the electric charge held in the MEM 59 is transferred to the FD 53 through the TG 52B.

Here, the insulating film 591 of the MEM 59 has the film thickness ET1 as the first electrical film thickness and the film thickness T1 as the first physical film thickness. The insulating film 591 is a specific example corresponding to a "first insulating film" in the present disclosure. In contrast, each of the gate insulating film 581 of the OFG 58, the gate insulating film 521A of the TG 52A, the gate insulating film 521B of the TG 52B, and the gate insulating film 541 of the RST 54 has the film thickness ET2 as the second electrical film thickness and the film thickness T2 as the second physical film thickness. The film thickness ET2 is larger than the film thickness ET1 (ET1<ET2). In addition, the film thickness T2 is larger than the film thickness T1 (T1<T2). The gate insulating films 581, 521A, 521B, and 541 are specific examples of a "second insulating film" in the present disclosure. It is to be noted that each of gate insulating films of the AMP 55 and the SEL 56 has, for example, the film thickness ET2 larger than the film thickness ET1, and the film thickness T2 larger than the film thickness T1.

In addition, the insulating film 591 of the MEM 59 and the gate insulating films 581, 521A, 521B, and 541 may each include a material of the same kind, that is, a material having the same dielectric constant. However, the dielectric constant of the insulating film 591 of the MEM 59 is desirably higher than each of the dielectric constants of the gate insulating films 581, 521A, 521B, and 541. This makes it possible to further increase a storage capacitance of the MEM 59, that is, a saturated electric charge amount per area occupied by a unit pixel.

In the sensor pixel 210 according to the present embodiment, the MEM 59 is further provided to thereby transfer the electric charge from the PD 51 to the MEM 59, which makes it possible to implement a memory-holding type global shutter. Specifically, in the sensor pixel 210, in a case where the drive signal S52A applied to a gate electrode of the TG 52A is turned on to turn on the TG 52A, the electric charge stored in the PD 51 is transferred to the MEM 59 through the TG 52A. The MEM 59 is a region that temporarily holds the electric charge stored in the PD 51 for implementing a global shutter function. The TG 52B transfers the electric charge held in the MEM 59 to the FD 53 in accordance with the drive signal S52B applied to the gate electrode layer 522B of the TG 52B. For example, in a case where the drive signal S52 is turned off to turn off the TG 52A and the drive signal S52B is turned on to turn on the TG 52B, the electric charge held in the MEM 59 is transferred to the FD 53 through the TG 52B.

[Effects of Sensor Pixel 210]

As described above, the sensor pixel 210 according to the present embodiment is able to enhance a saturated electric charge amount of the MEM 59 without increasing an area occupied by the MEM 59. That is, the saturated electric charge amount per unit area of the MEM 59 in each of the sensor pixels 210 is increased. Accordingly, in a global-shutter system solid-state imaging device including a plurality of such sensor pixels 210, it is possible to achieve high integration of the sensor pixels 210.

3. THIRD EMBODIMENT

[Configuration of Sensor Pixel 310]

Figure 8:
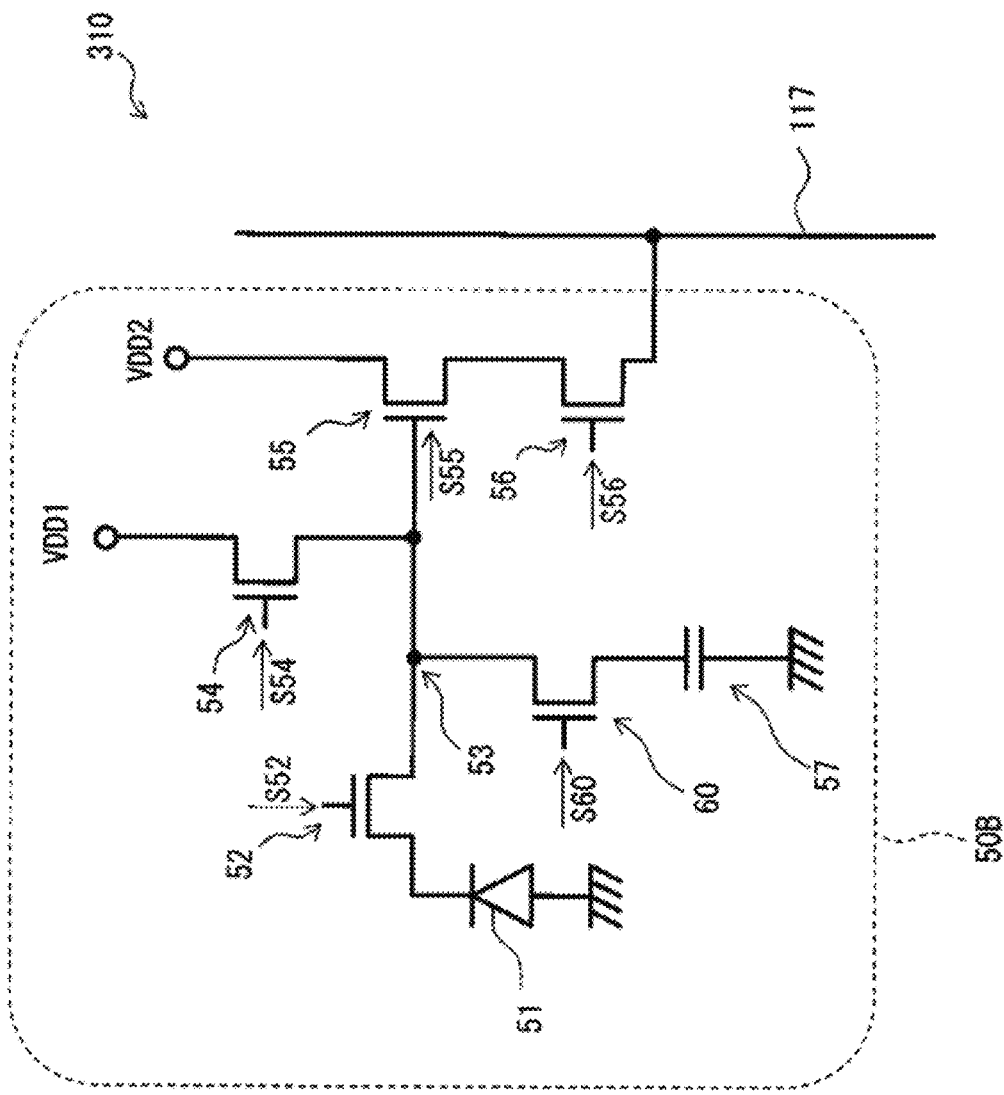
FIG. 8 is a circuit diagram illustrating a circuit configuration example of one sensor pixel in a solid-state imaging device according to a third embodiment of the present disclosure.
Figure 9:
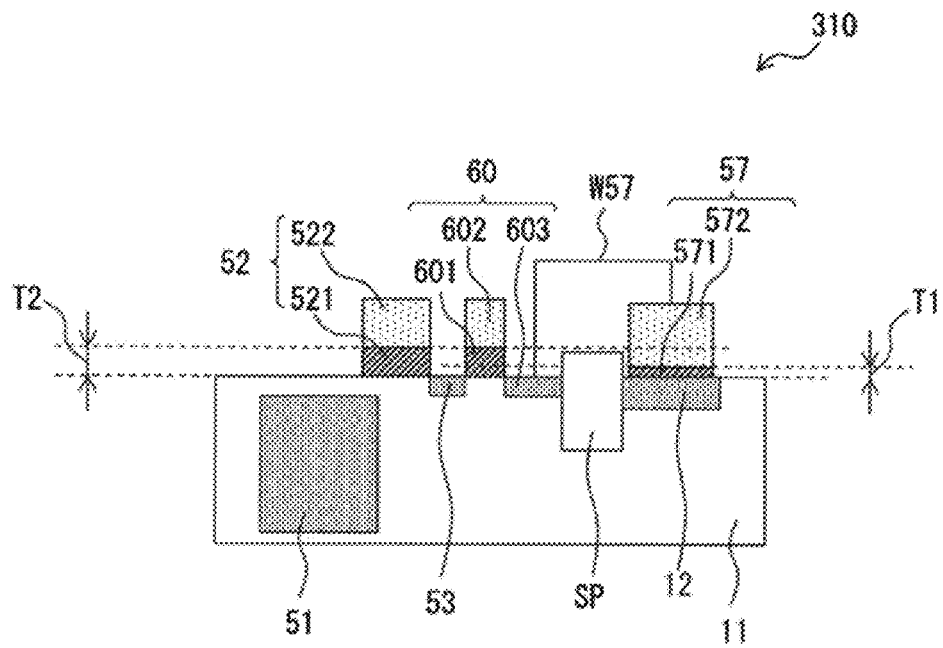
FIG. 9 is an explanatory diagram including a cross-sectional configuration example of a portion of the sensor pixel illustrated in FIG. 8.

FIG. 8 illustrates a circuit configuration example of a pixel circuit 50B in a sensor pixel 310 according to a third embodiment of the present technology. In addition, FIG. 9 illustrates a cross-sectional configuration example of the sensor pixel 310.

As illustrated in FIG. 8, the sensor pixel 310 further includes a switching transistor (FDG) 60 provided between the FD 53 and the CP 57 in addition to the sensor pixel 110 according to the above-described first embodiment. The sensor pixel 310 has substantially the same configuration as that of the sensor pixel 110, other than this point. As illustrated in FIG. 9, the FDG 60 includes, for example, an impurity diffusion layer 603 provided in the uppermost layer of the semiconductor layer 11, a gate insulating film 601 stacked on the semiconductor layer 11, and a gate electrode layer 602 stacked on the gate insulating film 601. A drive signal S60 is supplied to the gate electrode layer 602 by the vertical driver 112 and the horizontal driver 114 on the basis of drive control by the system controller 115. Here, applying the drive signal S60 to the gate electrode layer 602 causes the FD 53 and the CP 57 to be coupled to each other.

In the present embodiment, the FDG 60 is further included, which makes it possible to freely perform switching between a coupled state between the FD 53 and the CP 57 and a disconnected state between the FD 53 and the CP 57. In addition, an electrical film thickness of the gate insulating film 601 is, for example, substantially the same as the film thickness ET2 of the gate insulating film 521 of the TG 52, and is larger than the film thickness ET1 of the insulating film 571 of the CP 57. For example, in a case where respective constituent materials of the gate insulating film 601, the gate insulating film 521, and the insulating film 571 are the same, a physical film thickness of the gate insulating film 601 is, for example, substantially the same as the film thickness T2 of the gate insulating film 521 of the TG 52, and is larger than the film thickness T1 of the insulating film 571 of the CP 57.

[Effects of Sensor Pixel 310]

As described above, even in the sensor pixel 310 according to the present embodiment, the film thickness T1 (the film thickness ET1) of the insulating film 571 of the CP 57 is smaller than the film thicknesses T2 (the film thicknesses ET2) of gate insulating films of respective transistors included in the pixel circuit 50B, for example, the gate insulating film 521 of the TG 52 and the gate insulating film 601 of the FDG 60. This makes it possible to expect effects similar to those of the sensor pixel 110 according to the above-described first embodiment.

4. FOURTH EMBODIMENT

[Configuration of Sensor Pixel 410]

Figure 10:
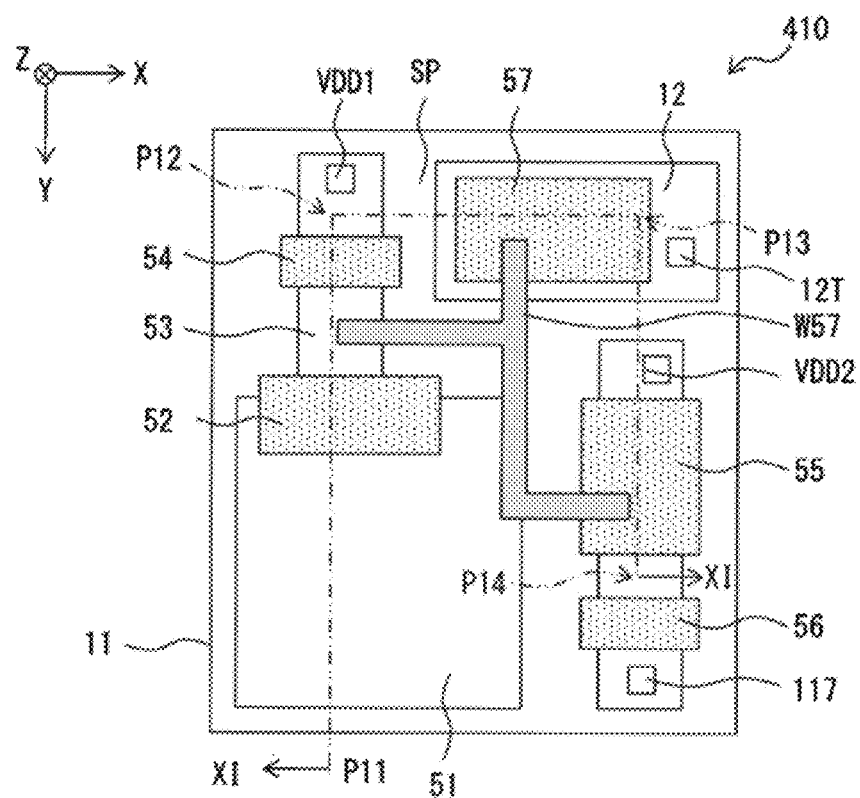
FIG. 10 is a plan view of a planar configuration example of one sensor pixel in a solid-state imaging device according to a fourth embodiment of the present disclosure.
Figure 11:
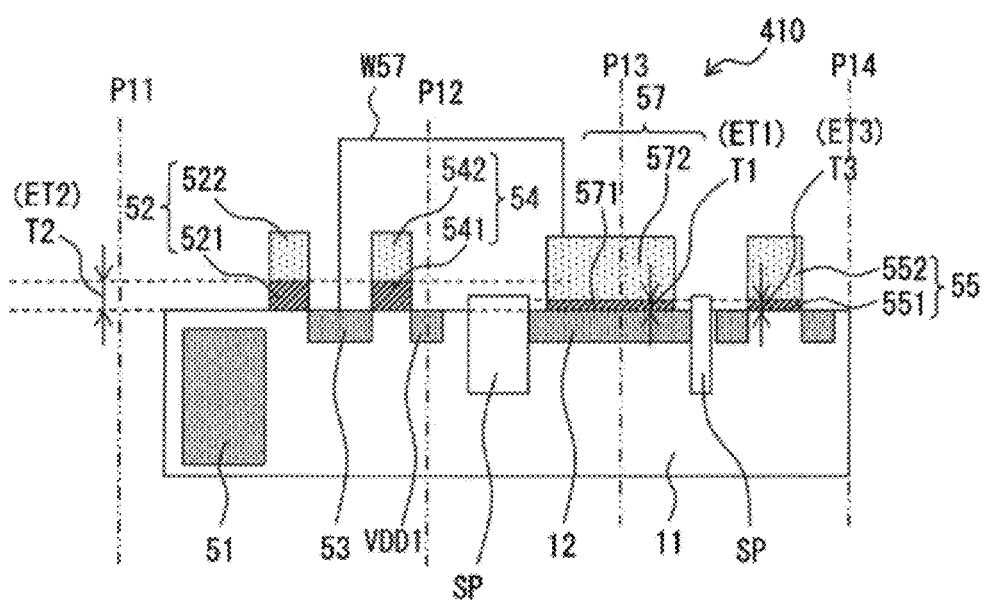
FIG. 11 is a cross-sectional view of a cross-sectional configuration example of the sensor pixel illustrated in FIG. 10.

FIG. 10 illustrates a planar configuration example of a sensor pixel 410 according to the second embodiment of the present technology. In addition, FIG. 11 illustrates a cross-sectional configuration example of the sensor pixel 410, and corresponds a cross section taken along a cut line XI-XI illustrated in FIG. 10 as viewed from the direction of an arrow. Note that in FIG. 11, each of a portion from a position P11 to a position P12 and a portion from a position P13 to a position P14 illustrates a YZ cross section along the Y-axis direction, and a portion from the position P12 to the position P13 illustrates an XZ cross section along the X-axis direction.

As illustrated in FIG. 11, the AMP 55 includes, on the semiconductor layer 11, a stacked structure in which a gate insulating film 551 including silicon oxide or the like and a gate electrode layer 552 are stacked in order. In the sensor pixel 110 according to the above-described first embodiment, the gate insulating film of the AMP 55 has, for example, the film thickness T2 (the film thickness ET2) larger than the film thickness T1 (the film thickness ET1). In contrast, in the sensor pixel 410 according to the present embodiment, the gate insulating film 551 of the AMP 55 has, for example, a film thickness ET3 as a third electrical film thickness and a film thickness T3 as a third physical film thickness. The film thickness ET3 of the gate insulating film 551 is, for example, smaller than the film thickness ET2 of the gate insulating film 521 of the TG 52. In addition, for example, in a case where respective constituent materials of the gate insulating film 551 and the gate insulating film 521 are the same, that is, in a case where the gate insulating film 551 and the gate insulating film 521 each include a material having the same dielectric constant, the film thickness T3 of the gate insulating film 551 is smaller than the film thickness T2 of the gate insulating film 521.

It is to be noted that FIG. 11 exemplifies a case where the film thickness T3 (the film thickness ET3) is substantially the same as the film thickness T1 (the film thickness ET1), but the film thickness T3 (the film thickness ET3) may be different from the film thickness T1 (the film thickness ET1).

Here, the AMP 55 is a specific example corresponding to a "second transistor" in the present invention, and the gate insulating film 551 is a specific example corresponding to a "third insulating film" in the present disclosure.

[Effects of Sensor Pixel 410]

As described above, even in the sensor pixel 410 according to the present embodiment, the film thickness T1 (the film thickness ET1) of the insulating film 571 of the CP 57 is smaller than the film thicknesses T2 (the film thicknesses ET2) of gate insulating films of respective transistors included in the sensor pixel 410, for example, the gate insulating film 521 of the TG 52. This makes it possible to expect effects similar to those of the sensor pixel 110 according to the above-described first embodiment.

In addition, in the sensor pixel 410 according to the present embodiment, the film thickness T3 (the film thickness ET3) of the gate insulating film 551 of the AMP 55 is smaller than the film thickness ET2 (the film thickness ET2) of each of the gate insulating film 521 of the TG 52 and the gate insulating film 601 of the FDG 60. This makes it possible to reduce RTS noise (random telegraph signal noise) in the AMP 55.

5. FIFTH EMBODIMENT

[Configuration of Sensor Pixel 510]

Figure 12:
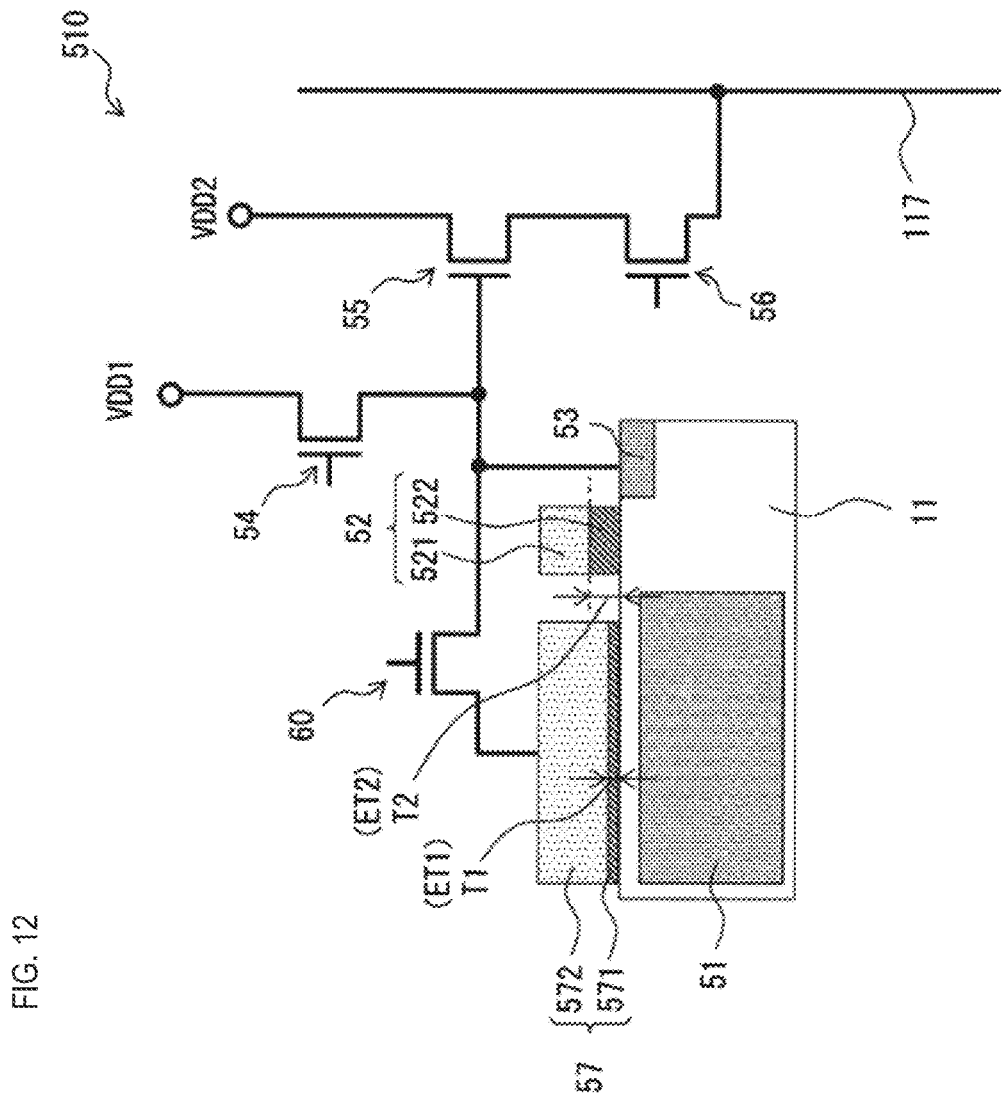
FIG. 12 is an explanatory diagram including a cross-sectional configuration example of one sensor pixel in a solid-state imaging device according to a fifth embodiment of the present disclosure.

FIG. 12 illustrates an entire configuration example of a sensor pixel 510 according to a fifth embodiment of the present technology. In the sensor pixel 510, the storage capacitor (CP) 57 is stacked at a position overlapping the photoelectric converter (PD) 51 in the thickness direction of the semiconductor layer 11. In the sensor pixel 510, the CP 57 is a MOS capacitor coupled to the FDG 60. The sensor pixel 510 has substantially the same configuration as that of the sensor pixel 310 according to the above-described third embodiment, other than this point.

In the sensor pixel 510, switching between a case of low conversion efficiency and a case of high conversion efficiency is possible in accordance with subject illuminance. That is, the capacitance of the FD 53 is switchable by an on-off operation of the FDG 60. For example, turning on the FDG 60 causes the FD 53 to be coupled to the CP 57 that is a MOS capacitor. As a result, the capacitance of the FD 53 is increased, and conversion efficiency is decreased.

[Effects of Sensor Pixel 510]

As described above, even in the sensor pixel 510 according to the present embodiment, the film thickness T1 (the film thickness ET1) of the insulating film 571 of the CP 57 is smaller than the film thickness T2 (the film thickness ET2) of each of gate insulating films of respective transistors included in the sensor pixel 510, for example, the gate insulating film 521 of the TG 52 and the gate insulating film 601 of the FDG 60. This makes it possible to expect effects similar to those of the sensor pixel 110 according to the above-described first embodiment.

Furthermore, in the sensor pixel 510 according to the present embodiment, the CP 57 is stacked on the PD 51, which makes it possible to increase a ratio of a formation area of the PD 51 to an area occupied by the sensor pixel 510. This is advantageous in high integration of a solid-state imaging device.

6. SIXTH EMBODIMENT

[Configuration of Sensor Pixel 610]

Figure 13:
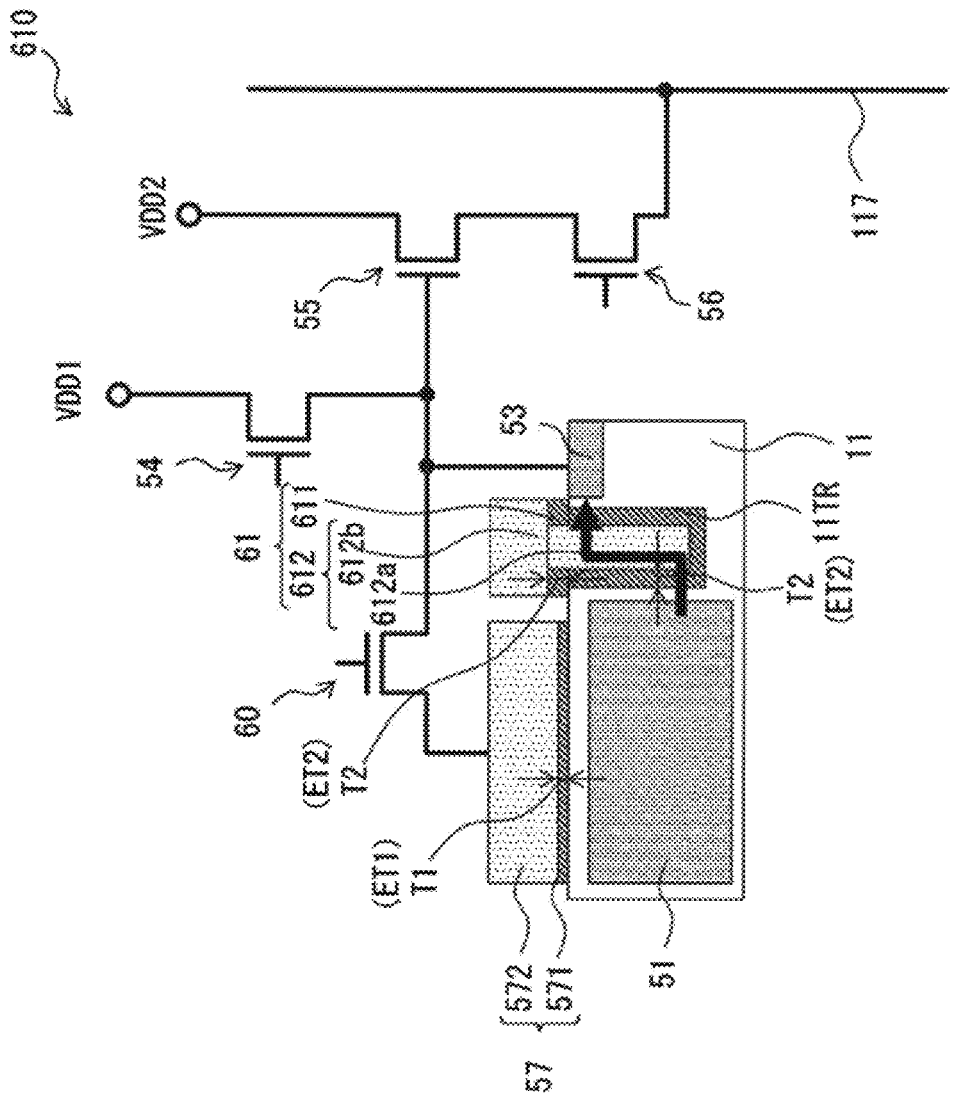
FIG. 13 is an explanatory diagram including a cross-sectional configuration example of one sensor pixel in a solid-state imaging device according to a sixth embodiment of the present disclosure.

FIG. 13 illustrates an entire configuration example of a sensor pixel 610 according to a sixth embodiment of the present technology. In the sensor pixel 610, a TG 61 is provided instead of the TG 52. The TG 61 is a vertical transistor that includes a gate insulating film 611 and a gate electrode 612 including a plug 612a extending in the thickness direction of the semiconductor layer 11. The plug 612a is inserted into a trench 11TR extending in the thickness direction of the semiconductor layer 11 formed in the semiconductor layer 11. A head 612b is provided at an upper end of the plug 612a. The gate electrode 612 is separated from the semiconductor layer 11 by the gate insulating film 611 covering an inner surface of the trench 11TR. The trench 11TR has a wall surface and a bottom surface entirely covered by the gate insulating film 611. The sensor pixel 610 has substantially the same configuration as that of the sensor pixel 510 according to the above-described fifth embodiment, other than this point.

It is to be noted that the TG 61 is a specific example corresponding to each of a "first transistor" and a "vertical transistor" in the present disclosure. In addition, the gate insulating film 611 is a specific example corresponding to a "second insulating film" in the present disclosure.

In the sensor pixel 610, a minimum value of the film thickness ET1 that is an electrical film thickness of the insulating film 571 of the CP 57 is smaller than a minimum value of the film thickness ET2 that is an electrical film thickness of the gate insulating film 611. Accordingly, for example, in a case where the dielectric constant of the insulating film 571 and the dielectric constant of the gate insulating film 611 are the same as each other, a minimum value of the film thickness T1 that is a physical film thickness of the insulating film 571 of the CP 57 is smaller than a minimum value of the film thickness T2 that is a physical film thickness of the gate insulating film 611. This makes it possible to expect effects similar to those of the sensor pixel 110 according to the above-described first embodiment.

The sensor pixel 610 is provided with the TG 61 that is a vertical transistor. This makes it possible to bring the plug 612a of the TG 61 closer to the PD 51. This makes it easier to transfer the electric charge from the PD 51 to the FD 53.

7. SEVENTH EMBODIMENT

[Configuration of Sensor Pixel 710]

Figure 14:
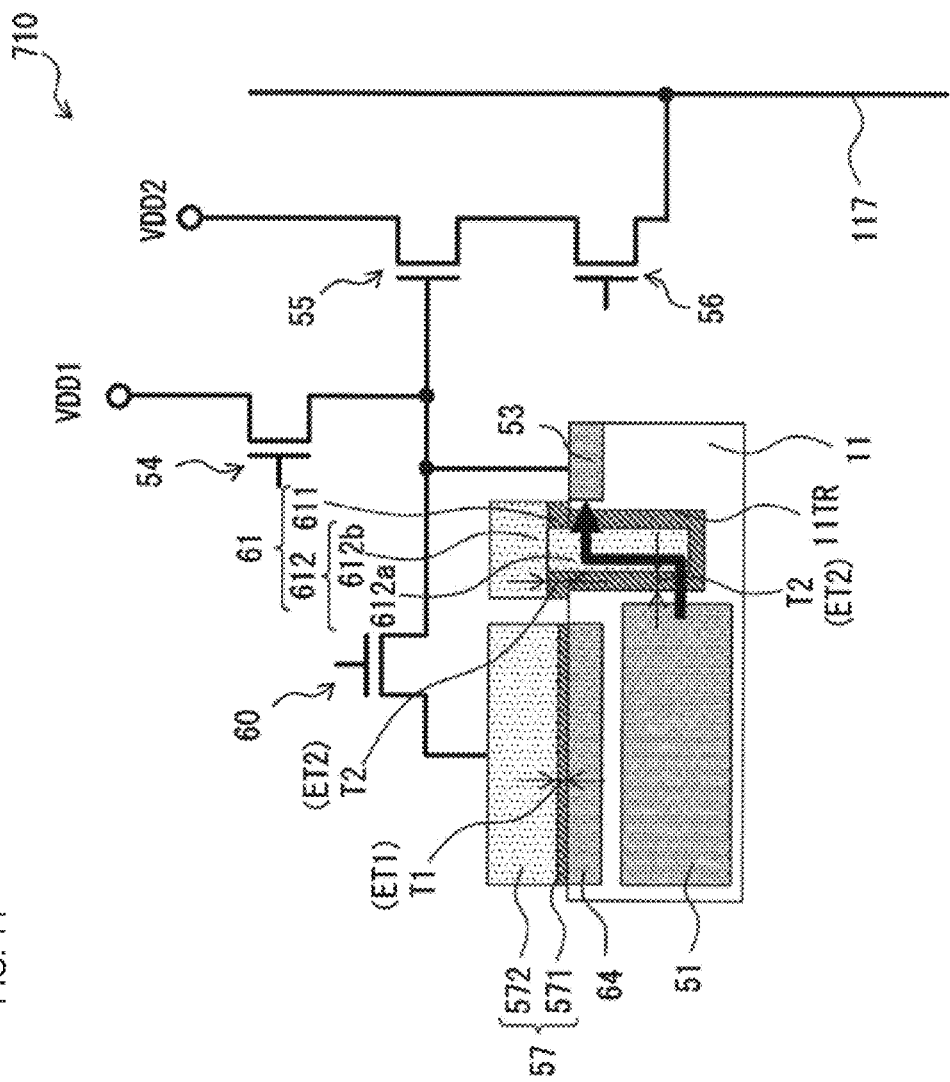
FIG. 14 is an explanatory diagram including a cross-sectional configuration example of one sensor pixel in a solid-state imaging device according to a seventh embodiment of the present disclosure.

FIG. 14 illustrates an entire configuration example of a sensor pixel 710 according to a seventh embodiment of the present technology. The sensor pixel 710 further includes, for example, an n+ region 64 between the PD 51 and the CP 57. That is, the CP 57 is an planar type n-type MOS capacitor. The sensor pixel 710 has substantially the same configuration as that of the sensor pixel 610 according to the above-described sixth embodiment, other than this point.

Even in the sensor pixel 710, the minimum value of the film thickness ET1 that is the electrical film thickness of the insulating film 571 of the CP 57 is smaller than the minimum value of the film thickness ET2 that is the electrical film thickness of the gate insulating film 611. Accordingly, in a case where the dielectric constant of the insulating film 571 and the dielectric constant of the gate insulating film 611 are the same as each other, the minimum value of the film thickness T1 that is the physical film thickness of the insulating film 571 of the CP 57 is smaller than the minimum value of the film thickness T2 that is the physical film thickness of the gate insulating film 611. This makes it possible to expect effects similar to those of the sensor pixel 110 according to the above-described first embodiment.

8. EIGHTH EMBODIMENT

[Configuration of Sensor Pixel 810]

Figure 15:
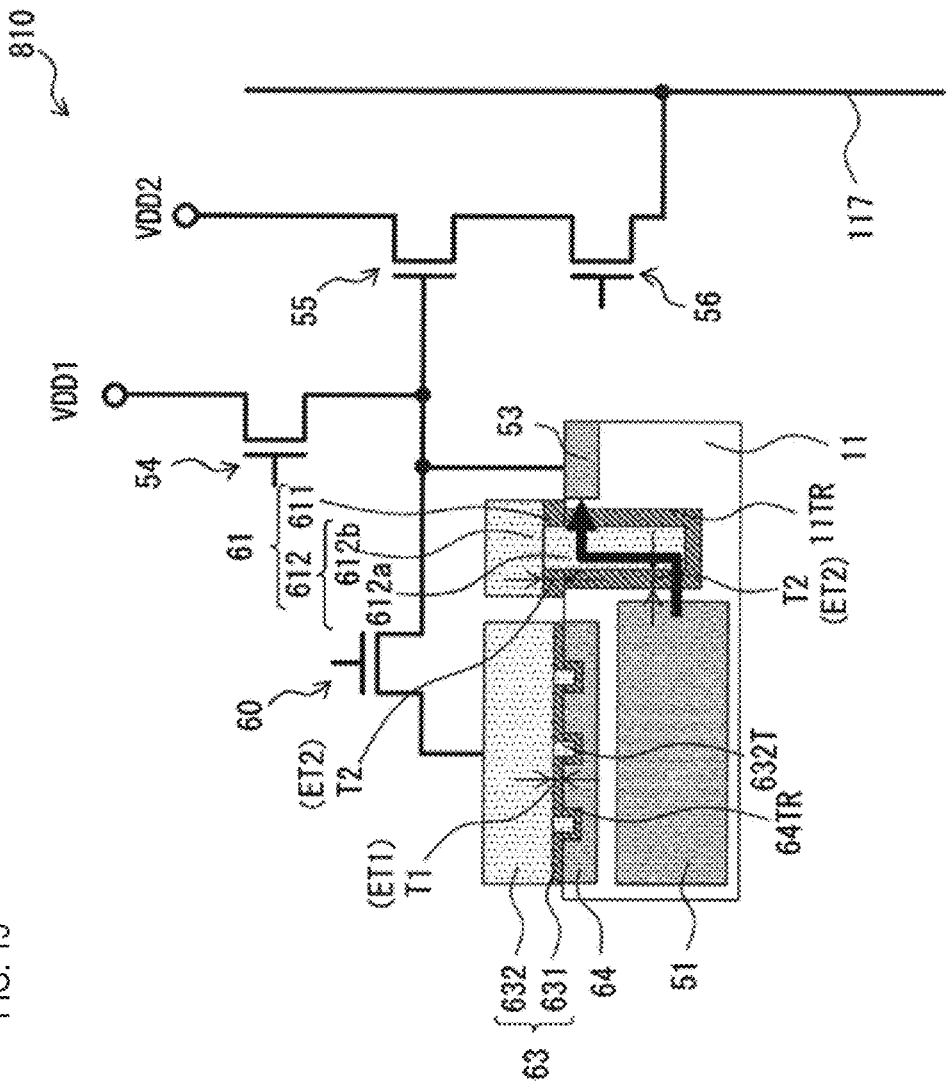
FIG. 15 is an explanatory diagram including a cross-sectional configuration example of one sensor pixel in a solid-state imaging device according to an eighth embodiment of the present disclosure.

FIG. 15 illustrates an entire configuration example of a sensor pixel 810 according to an eighth embodiment of the present technology. The sensor pixel 810 includes a storage capacitor (CP) 63 including an insulating film 631 and an electrically conductive layer 632, instead of the CP 57. In the sensor pixel 810, a plurality of trenches 64TR is formed in the n+ region 64, and the insulating film 631 of the CP 63 is provided to cover inner surfaces of the trenches 64TR. The electrically conductive layer 632 of the CP 63 includes projections 632T inserted into the plurality of trenches 64TR. That is, the CP 63 is a trench type MOS capacitor including a recessed and projected structure. The sensor pixel 810 has substantially the same configuration as that of the sensor pixel 710 according to the above-described seventh embodiment, other than these points.

In the sensor pixel 810, the minimum value of the film thickness ET1 that is an electrical film thickness of the insulating film 631 of the CP 63 is smaller than the minimum value of the film thickness ET2 that is the electrical film thickness of the gate insulating film 611. Accordingly, for example, in a case where a dielectric constant of the insulating film 631 and the dielectric constant of the gate insulating film 611 are the same as each other, the minimum value of the film thickness T1 that is a physical film thickness of the insulating film 631 of the CP 63 is smaller than the minimum value of the film thickness T2 that is the physical film thickness of the gate insulating film 611. This makes it possible to expect effects similar to those of the sensor pixel 110 according to the above-described first embodiment.

As described above, in the sensor pixel 810, the CP 63 including a recessed and projected structure is included instead of the CP 57, and a surface area of the insulating film 631 is increased more than a surface area of the insulating film 571, which makes it possible to increase a capacitance of the CP 63 more than a capacitance of the CP 57.

9. NINTH EMBODIMENT

Figure 16A:
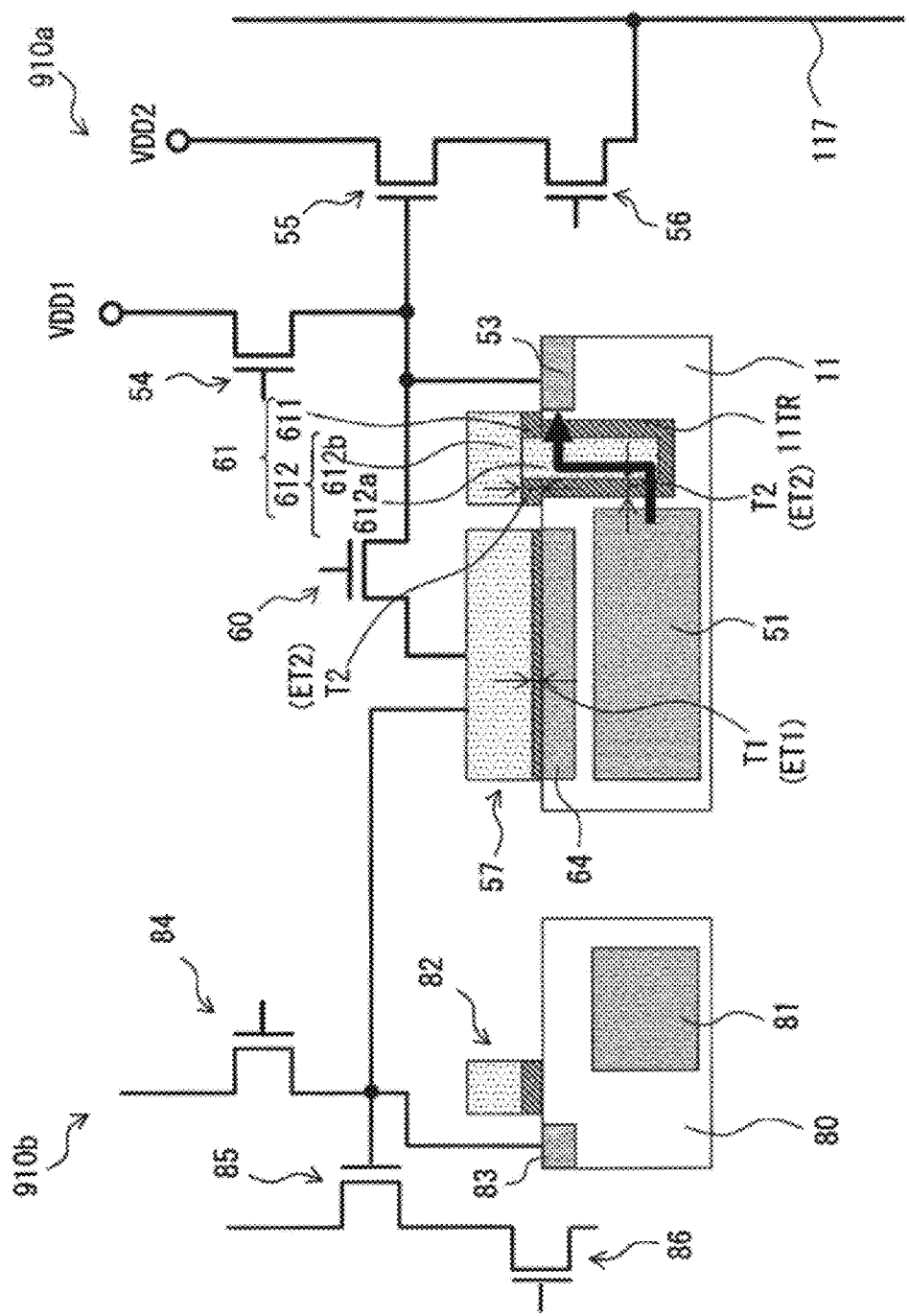
FIG. 16A is an explanatory diagram including a cross-sectional configuration example of two sensor pixels adjacent to each other in a solid-state imaging device according to a ninth embodiment of the present disclosure.

FIG. 16A illustrates a configuration example of a main part of a solid-state imaging device according to a ninth embodiment of the present technology. The solid-state imaging device according to the present embodiment includes a sensor pixel 910a and a sensor pixel 910b that are disposed adjacent to each other. The sensor pixel 910a has substantially the same configuration as that of the sensor pixel 710 according to the seventh embodiment illustrated in FIG. 14. The sensor pixel 910b is provided in a semiconductor layer 80 adjacent to the semiconductor layer 11, and includes a photoelectric converter (PD) 81, a transfer transistor (TG) 82, an electric charge-voltage converter (FD) 83, a reset transistor (RST) 84, an amplification transistor (AMP) 85, and a selection transistor (SEL) 86. The PD 81, the TG 82, the FD 83, the RST 84, the AMP 85, and the SEL 86 respectively have functions corresponding to the PD 51, the TG 52, the FD 53, the RST 54, the AMP 55, and the SEL 56. That is, for example, the PD 81 in the sensor pixel 910b generates an electric charge corresponding to an amount of received light by photoelectric conversion, similarly to the PD 51.

As described above, unlike the sensor pixel 910a, the sensor pixel 910b does not include a storage capacitor. Accordingly, the CP 57 in the sensor pixel 910a stores an electric charge generated by the PD 51 and also stores an electric charge generated by the PD 81.

In the solid-state imaging device according to the present embodiment, for example, sensitivity of the PD 51 of the sensor pixel 910a is higher than sensitivity of the PD 81 of the adjacent sensor pixel 910b. That is, a light-received area of the PD 51 in the sensor pixel 910a is larger than a light-received area of the PD 81 in the sensor pixel 910b. Accordingly, in the solid-state imaging device according to the present embodiment, the sensor pixel 910a including the CP 57 is used as a high-sensitivity pixel, and the sensor pixel 910b is used as a low-sensitivity pixel, which makes it possible to expand a dynamic range.

It is to be noted that in the solid-state imaging device illustrated in FIG. 16A, the sensor pixel 910b is provided in the semiconductor layer 80 different from the semiconductor layer 11; however, the sensor pixel 910b may be provided in the same semiconductor layer 11 where the sensor pixel 910a is provided.

Figure 16B:
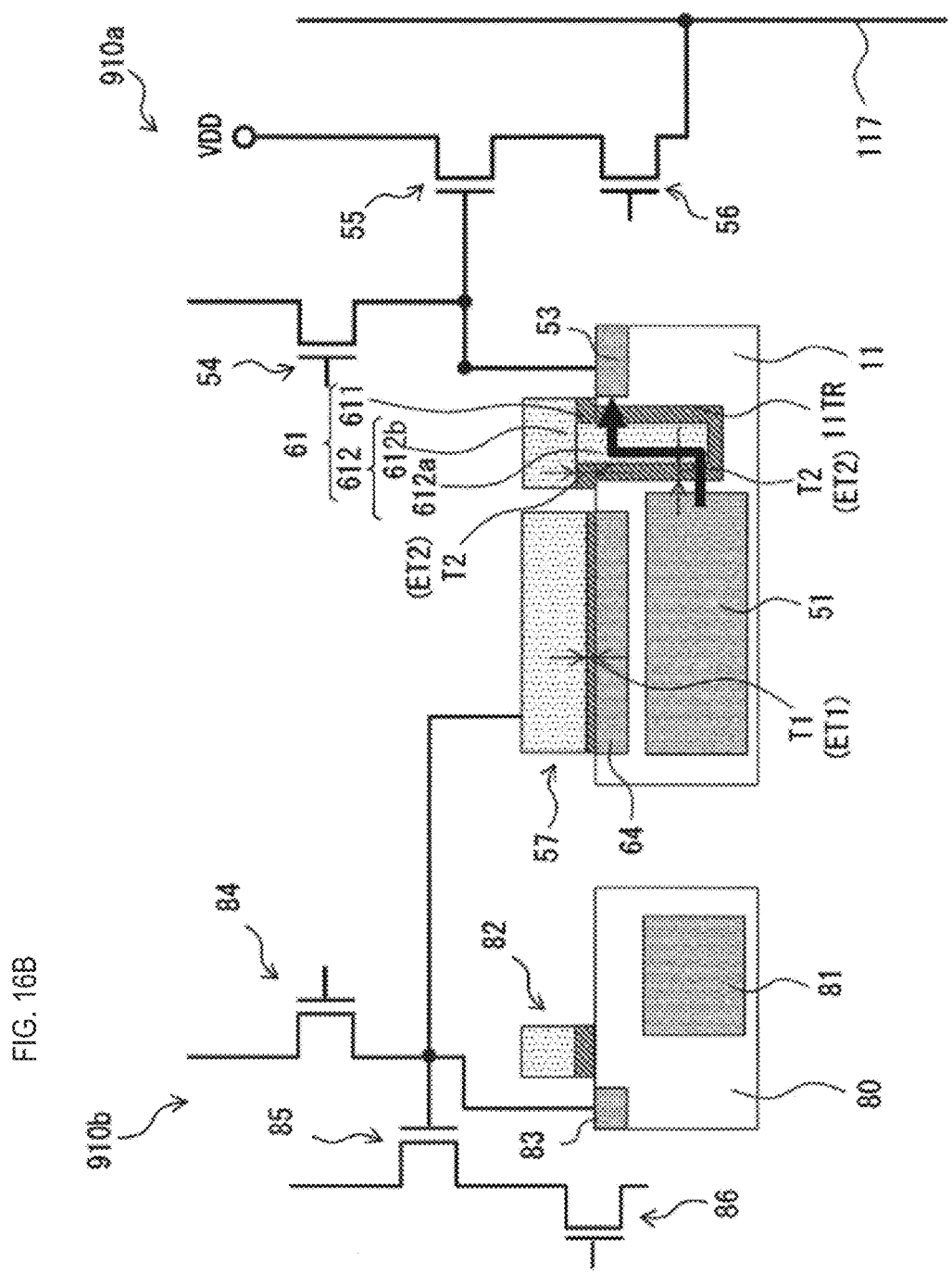
FIG. 16B is an explanatory diagram including a cross-sectional configuration example of a solid-state imaging device as a modification example of the solid-state imaging device illustrated in FIG. 16A.

In addition, in the solid-state imaging device illustrated in FIG. 16A, the CP 57 is shared between the sensor pixel 910a and the sensor pixel 910b. However, the present disclosure is not limited thereto. For example, like a solid-state imaging device in FIG. 16B as a modification example of the solid-state imaging device in FIG. 16A, the CP 57 may not be shared between the sensor pixel 910a and the sensor pixel 910b. In the solid-state imaging device in FIG. 16B, the CP 57 in the sensor pixel 910a is not coupled to the FD 53 of the sensor pixel 910a, but is coupled to the FD 83 of the sensor pixel 910b. In the solid-state imaging device in FIG. 16B, the electric charge generated by the PD 51 of the sensor pixel 910a is not stored in the CP 57, and the electric charge generated by the PD 81 of the sensor pixel 910b is stored in the CP 57.

10. TENTH EMBODIMENT

Figure 17:
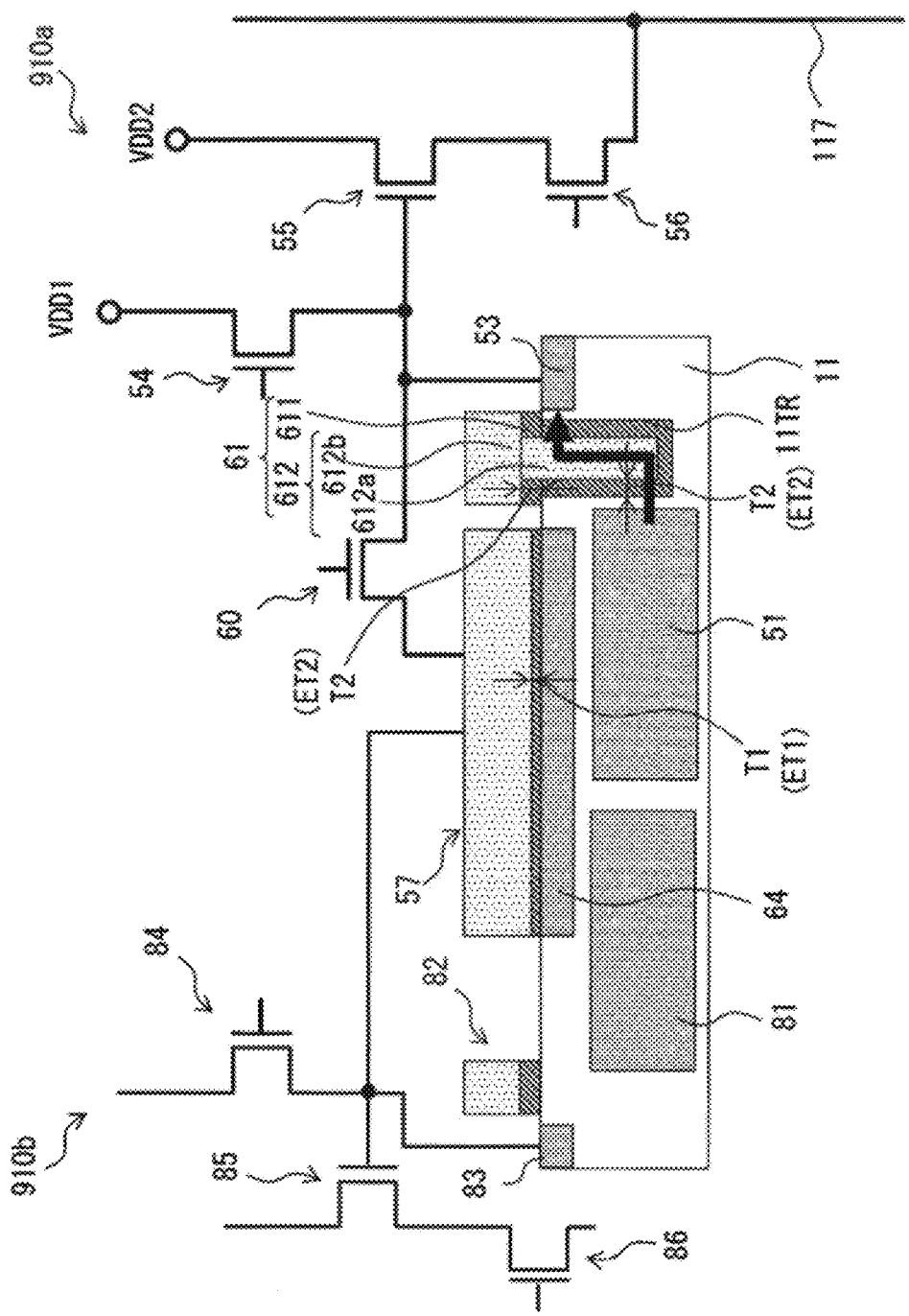
FIG. 17 is an explanatory diagram including a cross-sectional configuration example of two sensor pixels adjacent to each other in a solid-state imaging device according to a tenth embodiment of the present disclosure.

FIG. 17 illustrates a configuration example of a main part of a solid-state imaging device according to a tenth embodiment of the present technology. The solid-state imaging device according to the present embodiment includes the sensor pixel 910a and the sensor pixel 910b that are disposed adjacent to each other, similarly to the solid-state imaging device according to the above-described ninth embodiment. However, the sensor pixel 910b is provided in the same semiconductor layer 11 where the sensor pixel 910a is provided. Furthermore, in the solid-state imaging device according to the present embodiment, the CP 57 is provided over both the PD 51 and the PD 81 in an in-plane direction of the semiconductor layer 11, that is, a portion of the CP 57 is disposed at a position overlapping both the PD 51 and the PD 81 in the thickness direction of the semiconductor layer 11. The solid-state imaging device (FIG. 17) according to the present embodiment has substantially the same configuration as that of the solid-state imaging device (FIG. 16) according to the above-described ninth embodiment, other than these points.

As described above, in the present embodiment, one CP 57 is provided to overlap both two sensor pixels 910a and 910b adjacent to each other, which makes it possible to further increase the capacitance of the CP 57 without expanding an area occupied by the entire solid-state imaging device. This is advantageous in high integration of the solid-state imaging device.

11. APPLICATION EXAMPLE TO ELECTRONIC APPARATUS

Figure 18:
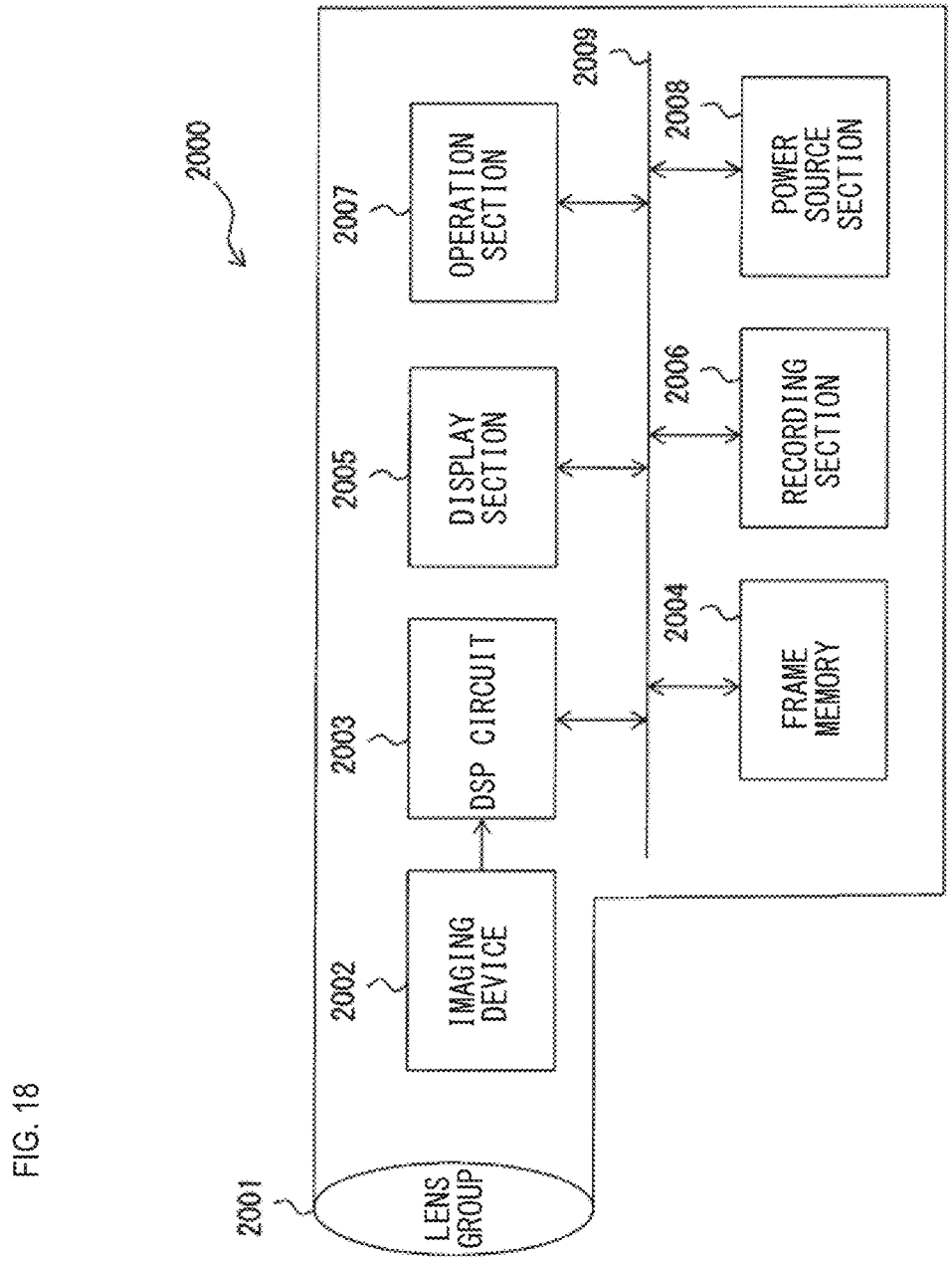
FIG. 18 is a schematic view of an entire configuration example of an electronic apparatus.

FIG. 18 is a block diagram illustrating a configuration example of a camera 2000 as an electronic apparatus to which the present technology is applied.

The camera 2000 includes an optical section 2001 including a lens group and the like, an imaging device (imaging device) 2002 to which the above-described solid-state imaging device 101 or the like (hereinafter referred to as the solid-state imaging device 101 or the like) is applied, and a DSP (Digital Signal Processor) circuit 2003 that is a camera signal processing circuit. In addition, the camera 2000 also includes a frame memory 2004, a display section 2005, a recording section 2006, an operation section 2007, and a power source section 2008. The DSP circuit 2003, the frame memory 2004, the display section 2005, the recording section 2006, the operation section 2007, and the power source section 2008 are coupled to one another through a bus line 2009.

The optical section 2001 captures incident light (image light) from a subject and forms an image on an imaging plane of the imaging device 2002. The imaging device 2002 converts the light amount of the incident light of which the image is formed on the imaging plane by the optical section 2001 into an electric signal on a pixel-by-pixel basis and outputs the electric signal as a pixel signal.

The display section 2005 includes, for example, a panel type display device such as a liquid crystal panel and an organic EL panel, and displays a moving image or a still image captured by the imaging device 2002. The recording section 2006 records the moving image or the still image captured by the imaging device 2002 on a recording medium such as a hard disk or a semiconductor memory.

The operation section 2007 is operated by a user to issue operation instructions for various functions of the camera 2000. The power source section 2008 supplies the DSP circuit 2003, the frame memory 2004, the display section 2005, the recording section 2006, and the operation section 2007 with various types of power as power for operating these supply targets as appropriate.

As described above, use of the above-described solid-state imaging device 101A or the like as the imaging device 2002 makes it possible to expect acquirement of a favorable image.

12. EXAMPLE OF PRACTICAL APPLICATION TO MOBILE BODY

The technology (the present technology) according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, or a robot.

Figure 19:
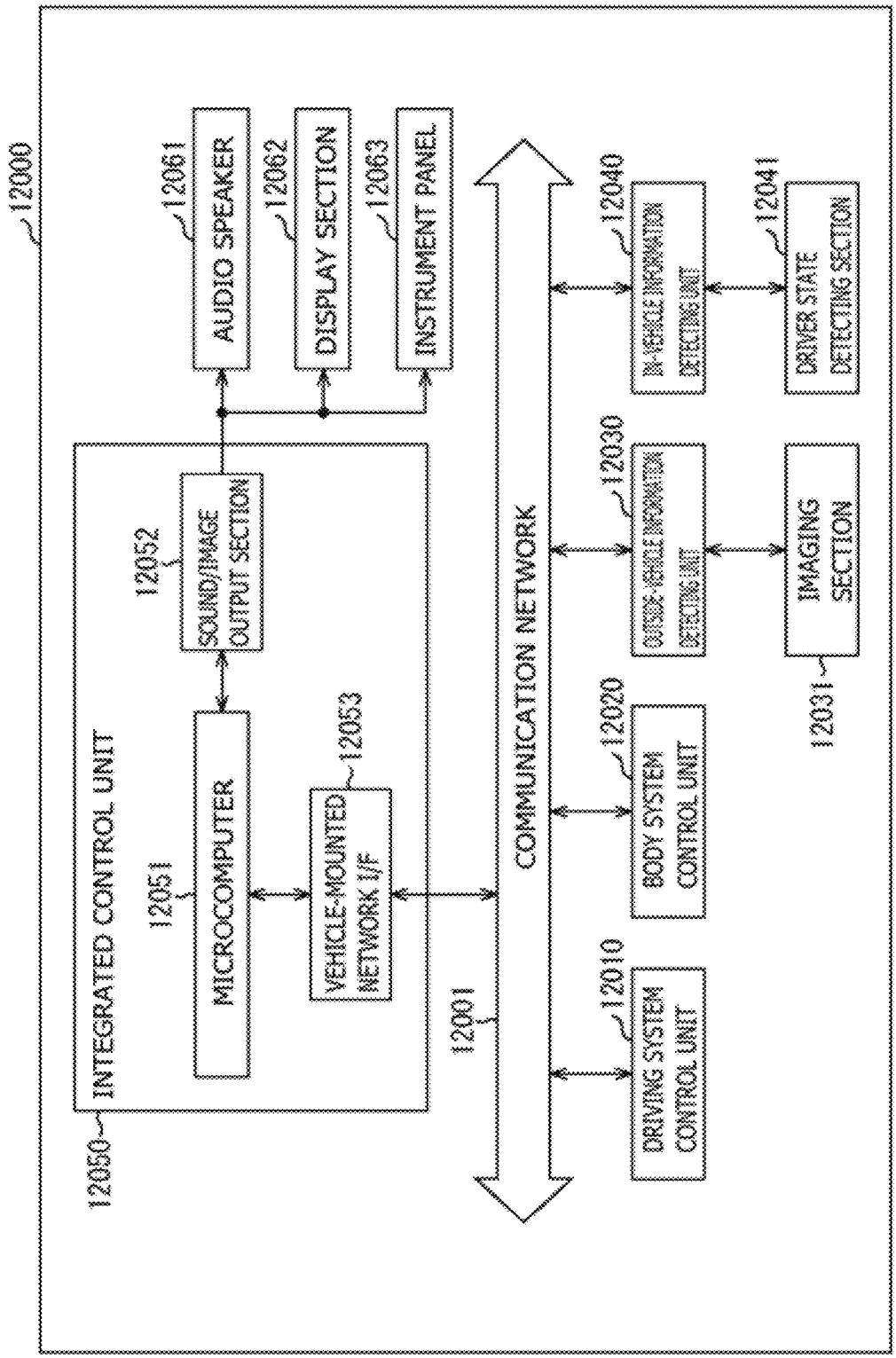
FIG. 19 is a block diagram depicting an example of schematic configuration of a vehicle control system.

FIG. 19 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 11, an audio speaker 12061, a display section 12062, and an instrument panel 12063 are illustrated as the output device. The display section 12062 may, for example, include at least one of an on-board display and a head-up display.

Figure 20:
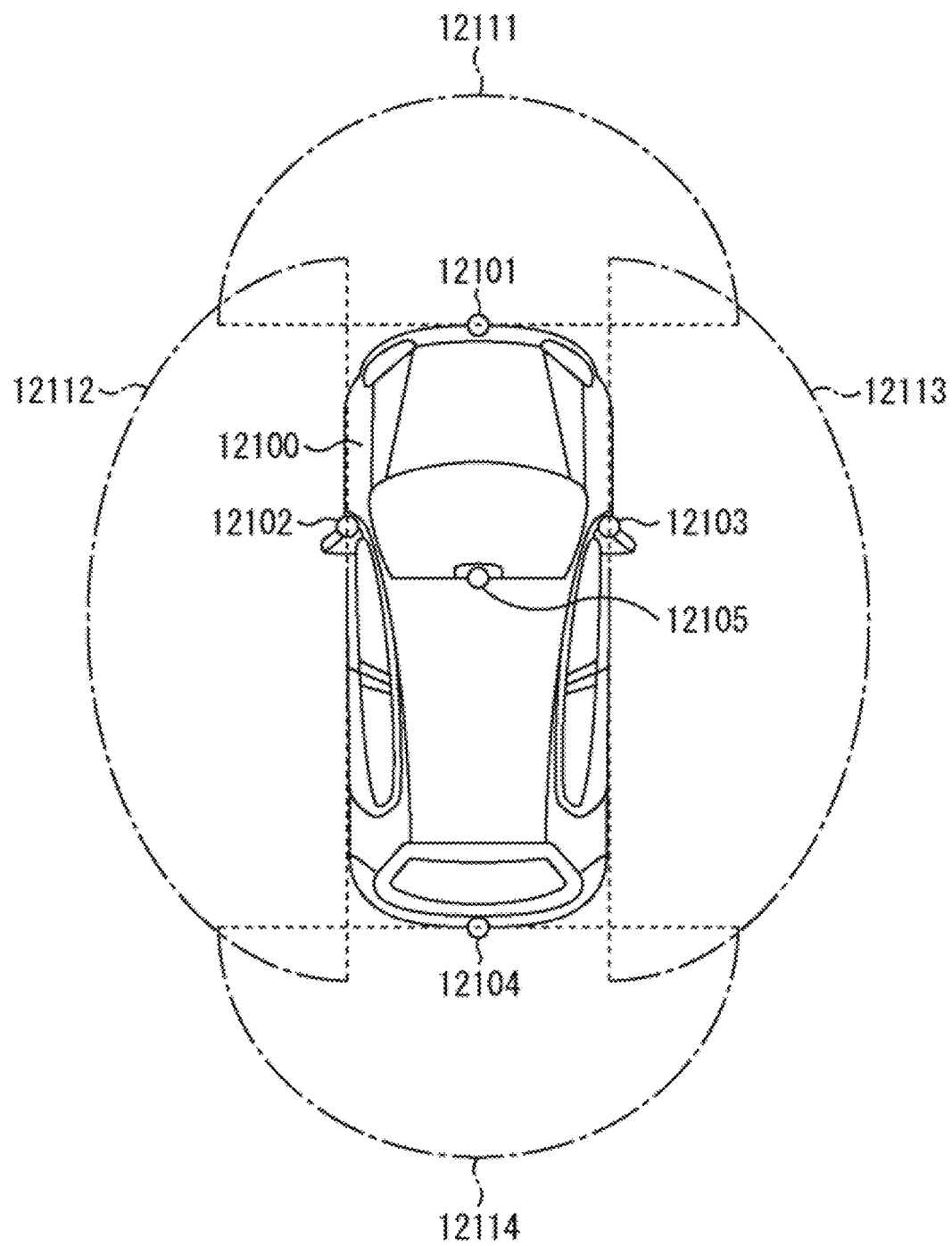
FIG. 20 is a diagram of assistance in explaining an example of installation positions of an outside-vehicle information detecting section and an imaging section.

FIG. 20 is a diagram depicting an example of the installation position of the imaging section 12031.

In FIG. 20, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to the imaging section 12031 among the components described above. Specifically, the solid-state imaging device 101A or the like illustrated in FIG. 1 etc. is applicable to the imaging section 12031. Applying the technology according to the present disclosure to the imaging section 12031 makes it possible to expect a superior operation of the vehicle control system.

13. OTHER MODIFICATION EXAMPLES

Although the present disclosure has been described with reference to some embodiments and modification examples, the present disclosure is not limited to the embodiments and the like described above, and may be modified in a variety of ways. For example, the solid-state imaging device of the present disclosure is not limited to a solid-state imaging device including the pixel circuit described in any of the embodiments and the like described above, and may include a solid-state imaging device including any of various pixel circuits.

Figure 21B:
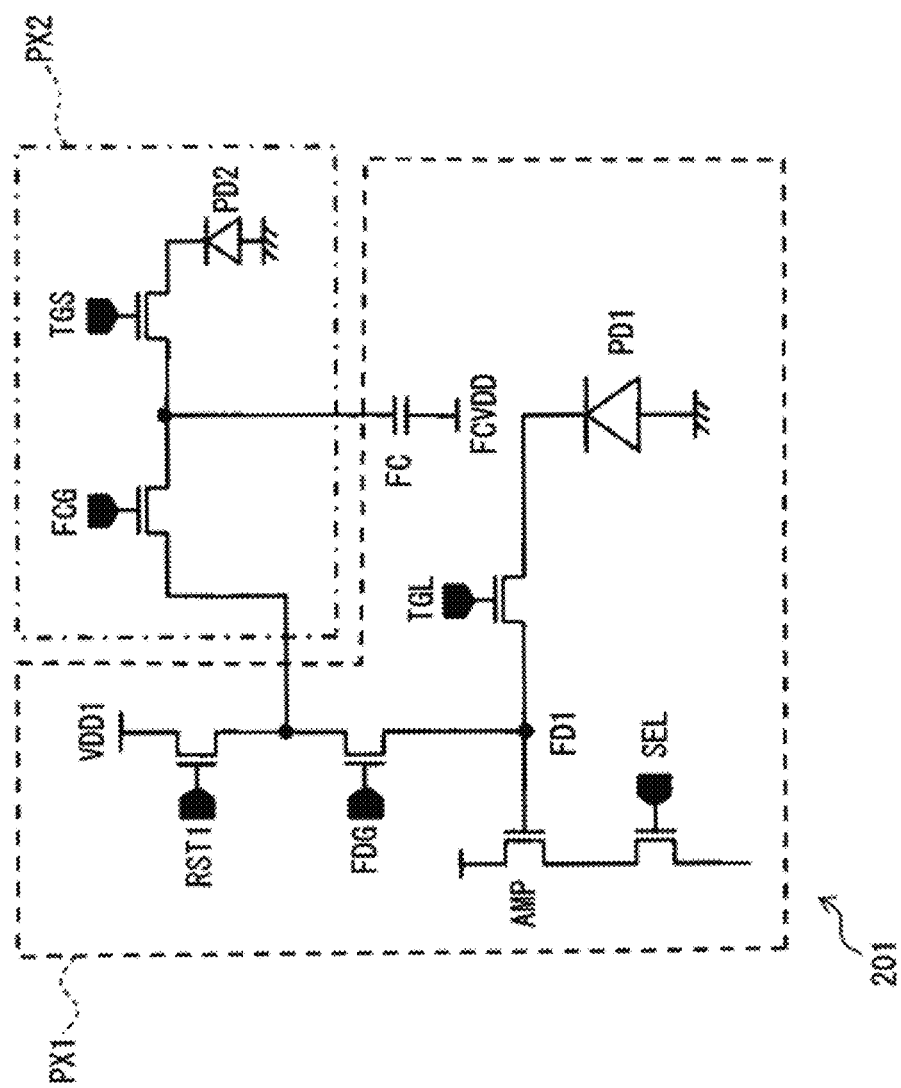
FIG. 21B is a circuit diagram illustrating a configuration example of a main part of the solid-state imaging device as the third modification example illustrated in FIG. 21A.

FIG. 21A is a cross-sectional view of a configuration example of a main part of a solid-state imaging device 201 as a third modification example of the present disclosure. FIG. 21B is a circuit diagram of the solid-state imaging device 201. The solid-state imaging device 201 includes two sensor pixels PX1 and PX2 that are disposed adjacent to each other. The sensor pixel PX1 includes a photoelectric converter PD1 embedded in a semiconductor layer 200, a transfer gate TGL provided in proximity to a front surface 200A of the semiconductor layer 200, an electric charge-voltage converter FD1, an electric charge-voltage conversion gate FDG, a reset transistor RST1, an amplification transistor AMP, a selection transistor SEL56, and a floating capacitor FC. Here, an end on a side opposite to the electric charge-voltage conversion gate FDG of the reset transistor RST is coupled to the power source VDD1. The sensor pixel PX2 includes a photoelectric converter PD2 embedded in the semiconductor layer 200, and a transfer gate TGS and a floating capacitor gate FCG that are provided in proximity to the front surface 200A of the semiconductor layer 200. Here, a first end of the floating capacitor FC is coupled to a power source FCVDD in the sensor pixel PX1, and a second end of the floating capacitor FC is coupled to a middle portion between the transfer gate TGS and the floating capacitor gate FCG in the sensor pixel PX2. In the sensor pixel PX1, a color filter CF1 and an on-chip lens LN1 are stacked in order on a back surface 200B of the semiconductor layer 200. Similarly, in the sensor pixel PX2, a color filter CF2 and an on-chip lens LN2 are stacked in order on the back surface 200B of the semiconductor layer 200. A light-shielding film BM is selectively embedded in each of the color filters CF1 and CF2. The light-shielding film BM is provided in a boundary portion between sensor pixels adjacent to each other. A light-shielding wall BW extending in a thickness direction of the semiconductor layer 200 is provided directly below each of the light-shielding films BM. The light-shielding film BM and the light-shielding wall BW include, for example, but not limited to, metal.

In the solid-state imaging device 201, the photoelectric converter PD1 and the floating capacitor FC in the sensor pixel PX1 are stacked to overlap each other in the thickness direction of the semiconductor layer 200. In addition, the transfer gate TGL is a vertical type gate extending to the photoelectric converter PD1 in the thickness direction of the semiconductor layer 200.

Figure 22:
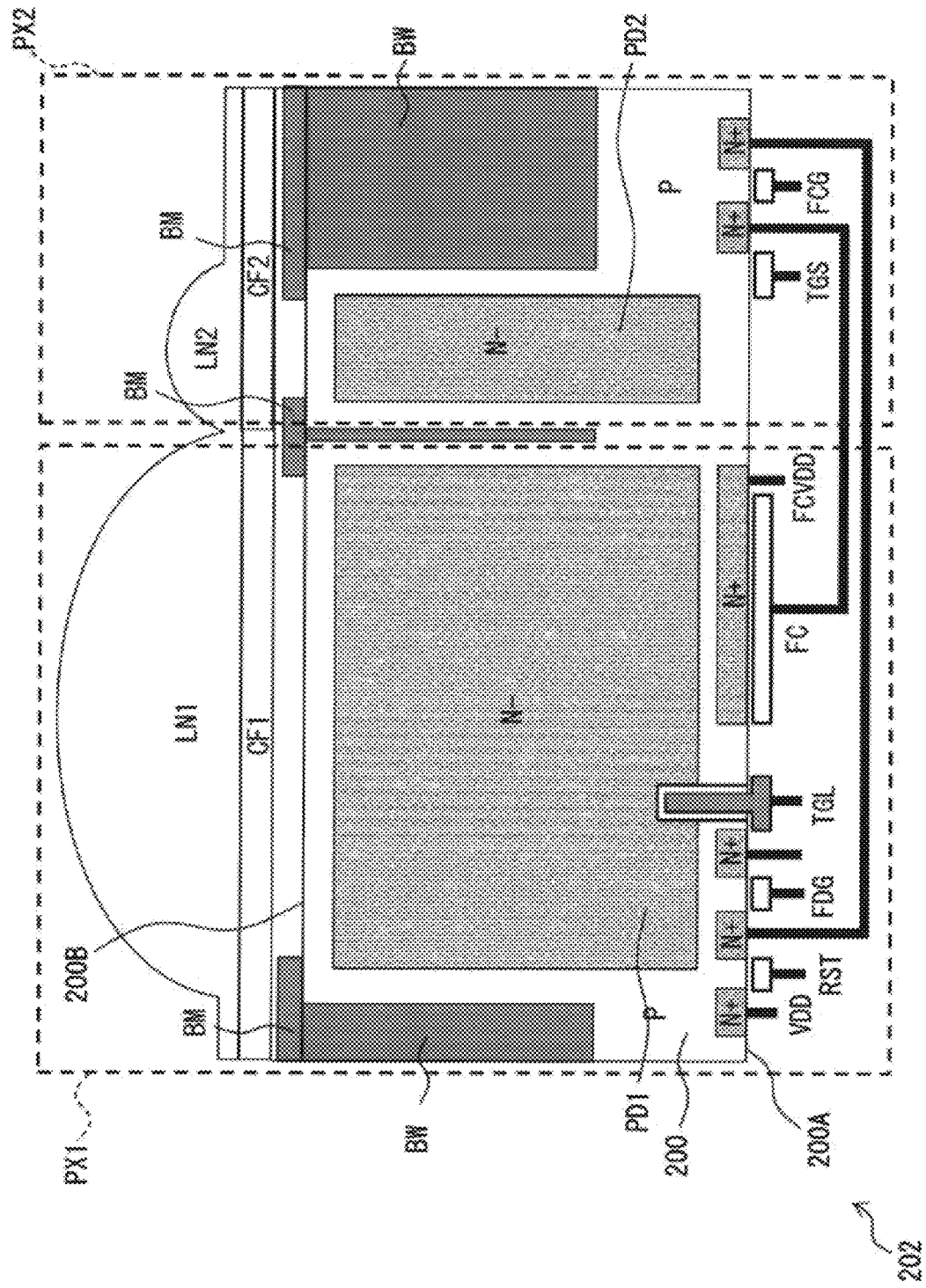
FIG. 22 is a cross-sectional view of a configuration example of a main part of a solid-state imaging device as a fourth modification example.

In addition, in the solid-state imaging device 201, the light-shielding film BM is embedded in each of the color filters CF1 and CF2, but the present disclosure is not limited thereto. For example, like a solid-state imaging device 202 as a fourth modification example of the present disclosure illustrated in FIG. 22, a layer including the color filters CF1 and CF2 may be provided separately from a layer including the light-shielding film BM.

In addition, in the respective embodiments described above, the plug of the gate electrode of the vertical transistor is provided at a position different from the photoelectric converter in plan view, but the present disclosure is not limited thereto. Furthermore, the respective embodiments described above have exemplified the gate electrode of the vertical transistor including a plug and a cap that covers an upper end of the plug, but the present disclosure is not limited thereto. That is, the present disclosure includes respective modes illustrated in FIGS. 23 to 25.

Figure 23:
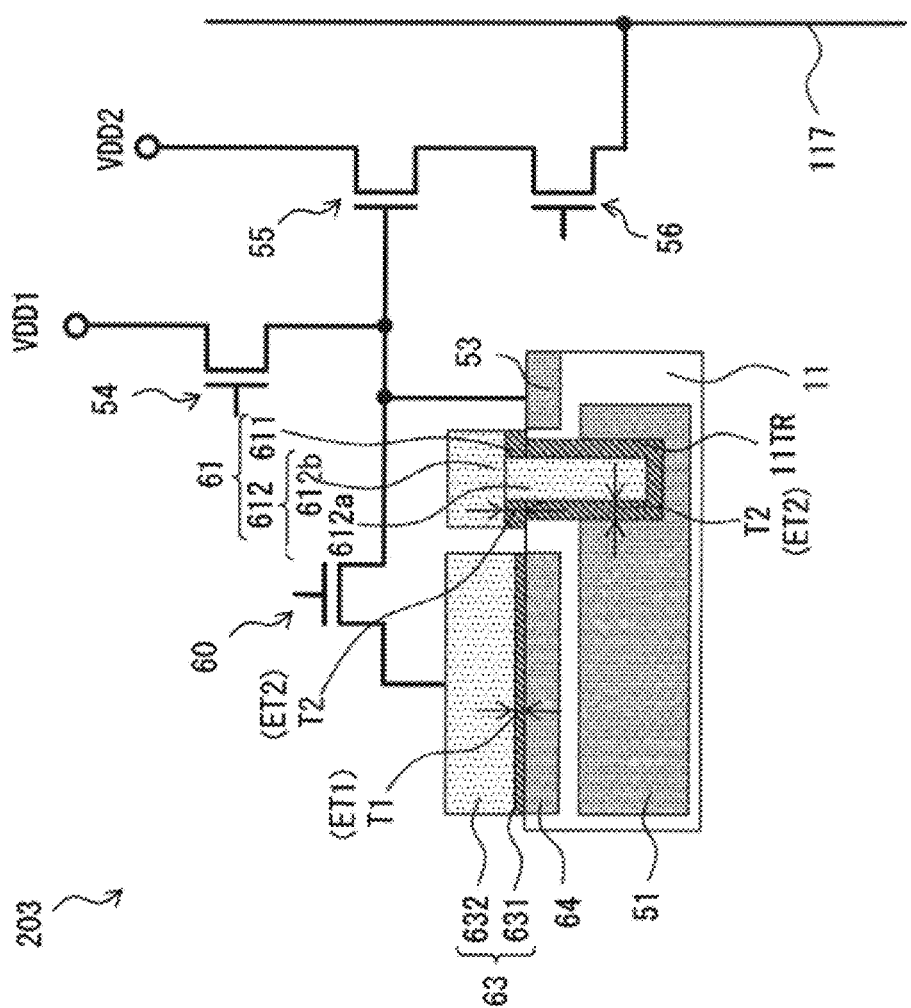
FIG. 23 is a cross-sectional view of a configuration example of a main part of a solid-state imaging device as a fifth modification example.

Specifically, like a solid-state imaging device 203 as a fifth modification example of the present disclosure illustrated in FIG. 23, the plug 612a of the gate electrode 612 of the TG 61 that is a vertical transistor may be provided at a position overlapping the PD 51 in plan view, and the plug 612a may be inserted into the PD 51.

Figure 24:
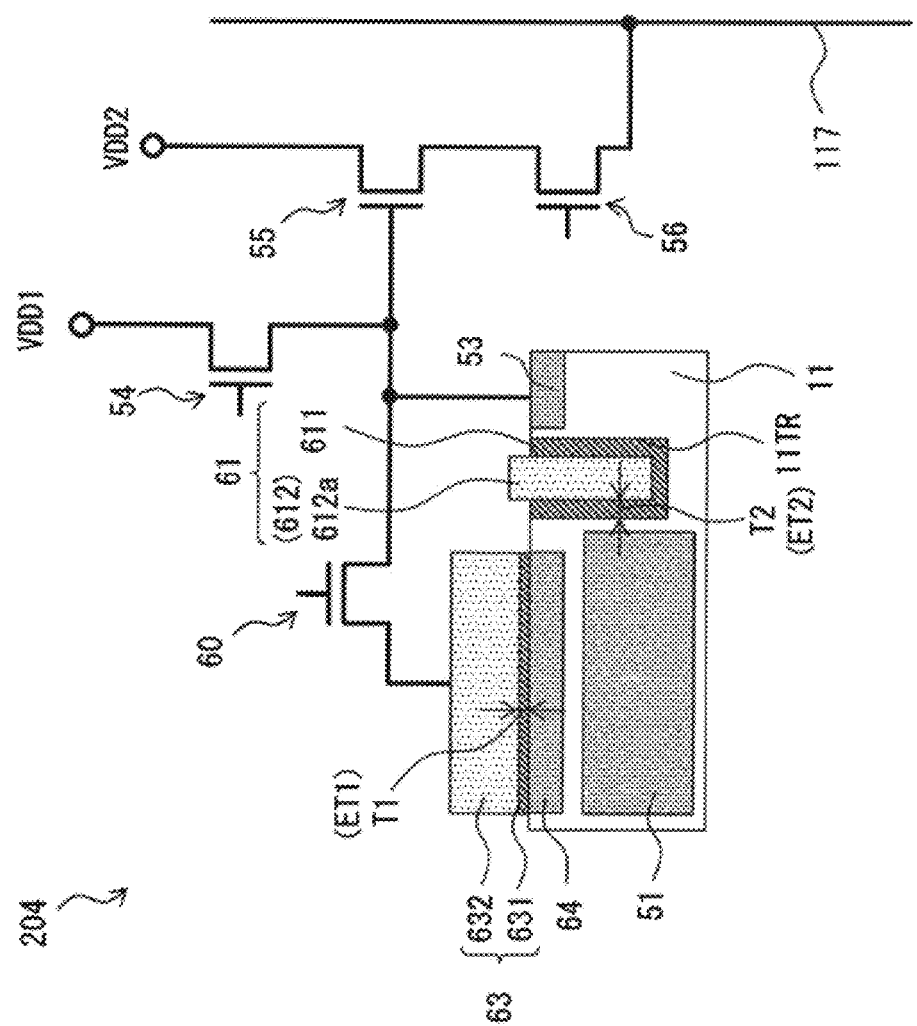
FIG. 24 is a cross-sectional view of a configuration example of a main part of a solid-state imaging device as a sixth modification example.

In addition, like a solid-state imaging device 204 as a sixth modification example of the present disclosure illustrated in FIG. 24, the gate electrode 612 of the TG 61 that is a vertical transistor may include only the plug 612a without including the head 612b.

Figure 25:
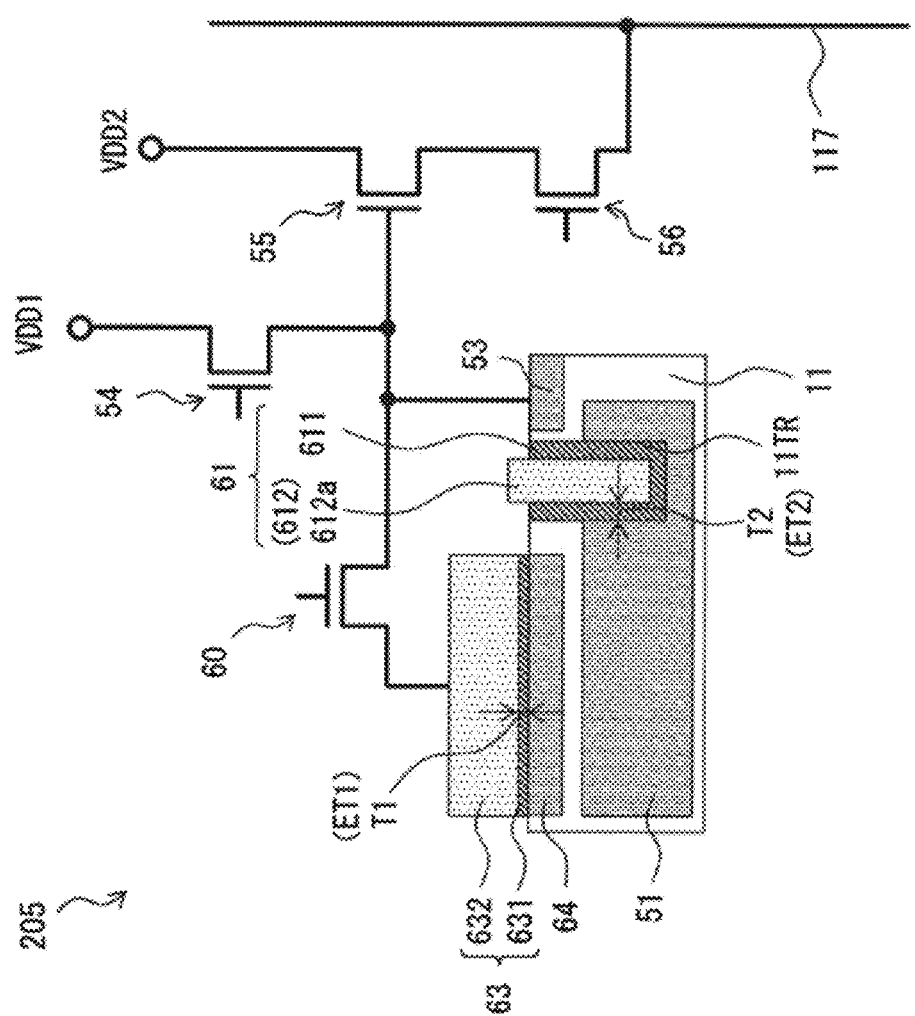
FIG. 25 is a cross-sectional view of a configuration example of a main part of a solid-state imaging device as a seventh modification example.

Furthermore, like a solid-state imaging device 205 as a seventh modification example of the present disclosure illustrated in FIG. 25, the gate electrode 612 of the TG 61 that is a vertical transistor may include only the plug 612a without including the head 612b, and the plug 612a may be inserted into the PD 51.

In addition, an imaging device of the present disclosure is not limited to an imaging device that detects a light amount distribution of visible light and acquires the light amount distribution of visible light as an image, but may be an imaging device that acquires, as an image, a distribution of an amount of received infrared light, X-rays, particles, or the like.

As described above, according to the solid-state imaging device and the electronic apparatus as embodiments of the present disclosure, the solid-state imaging device and the electronic apparatus are suitable for high integration of pixels. It is to be noted that effects of the present disclosure are not limited thereto, and may be any of effects described below. In addition, the present technology may have the following configurations.

(1)
A solid-state imaging device including:
a semiconductor layer;
a photoelectric converter that is provided in the semiconductor layer, and generates an electric charge corresponding to a received light amount by photoelectric conversion;
a storage capacitor that is provided on the semiconductor layer, and includes a first insulating film having a first electrical film thickness; and
a first transistor that is provided on the semiconductor layer, and includes a second insulating film having a second electrical film thickness larger than the first electrical film thickness.

(2)
The solid-state imaging device according to (1), further including a second transistor that includes a third insulating film having a third electrical film thickness smaller than the second electrical film thickness.

(3)
The solid-state imaging device according to (2), in which the second transistor includes an amplification transistor, and the third insulating film includes a gate insulating film of the amplification transistor.

(4)
The solid-state imaging device according to any one of (1) to (3), in which the storage capacitor is stacked at a position overlapping the photoelectric converter in a thickness direction of the semiconductor layer.

(5)
The solid-state imaging device according to (4), in which
the first transistor includes a vertical transistor including a gate electrode, as a second electrically conductive layer, extending in the thickness direction of the semiconductor layer, and
the second insulating film includes a gate insulating film of the vertical transistor.

(6)
The solid-state imaging device according to (5), in which a smallest physical film thickness in the second insulating film is larger than a largest physical film thickness in the first insulating film.

(7)
The solid-state imaging device according to (5) or (6), in which
the gate electrode of the vertical transistor includes a plug inserted into a trench that is formed in the semiconductor layer and extends in the thickness direction, and
the trench has a wall surface and a bottom surface entirely covered by the second insulating film.

(8)
The solid-state imaging device according to any one of (1) to (7), in which the storage capacitor includes a MOS capacitor.

(9)
The solid-state imaging device according to (8), in which the MOS capacitor is of a planar type.

(10)
The solid-state imaging device according to (8), in which the MOS capacitor is of a trench type.

(11)

The solid-state imaging device according to any one of (5) to (10), in which the storage capacitor stores the electric charge generated by the photoelectric converter.

(12)

The solid-state imaging device according to any one of (1) to (11), further including an adjacent pixel provided in the semiconductor layer to be disposed adjacent to a pixel including the photoelectric converter and the storage capacitor, in which the adjacent pixel includes an adjacent photoelectric converter that generates an electric charge corresponding to a received light amount by photoelectric conversion, and the storage capacitor is provided over both the photoelectric converter and the adjacent photoelectric converter in an in-plane direction of the semiconductor layer.

(13)

The solid-state imaging device according to (12), in which the storage capacitor stores the electric charge generated by the photoelectric converter, and also stores the electric charge generated by the adjacent photoelectric converter.

(14)

The solid-state imaging device according to (12) or (13), in which sensitivity of the photoelectric converter is higher than sensitivity of the adjacent photoelectric converter.

(15)

The solid-state imaging device according to any one of (1) to (11), further including an adjacent pixel provided in the semiconductor layer to be disposed adjacent to a pixel including the photoelectric converter and the storage capacitor, in which the adjacent pixel includes an adjacent photoelectric converter that generates an electric charge corresponding to a received light amount by photoelectric conversion, and the storage capacitor stores the electric charge generated by the adjacent photoelectric converter.

(16)

The solid-state imaging device according to any one of (1) to (15), in which the first transistor includes a transfer transistor that transfers the electric charge from the photoelectric converter to a transfer destination.

(17)

The solid-state imaging device according to (16), further including an electric-charge voltage converter as the transfer destination, the electric-charge voltage converter that is provided in the semiconductor layer, and converts the electric charge generated by photoelectric converter into a voltage.

(18)

The solid-state imaging device according to (17), in which the storage capacitor is coupled to the electric charge-voltage converter.

(19)

The solid-state imaging device according to (17) or (18), in which the storage capacitor includes an electric charge holding section as the transfer destination, the electric charge holding section that is provided between the photoelectric converter and the electric charge-voltage converter, and temporarily holds the electric charge generated by the photoelectric converter before transferring the electric charge to the electric charge-voltage converter.

(20)

The solid-state imaging device according to any one of (17) to (19), further including a switching section that is provided between the storage capacitor and the electric charge-voltage converter, and performs electrical coupling between the storage capacitor and the electric charge-voltage converter and electrical disconnection between the storage capacitor and the electric charge-voltage converter.

(21)

The solid-state imaging device according to any one of (1) to (20), in which a first dielectric constant of the first insulating film is higher than a second dielectric constant of the second insulating film.

(22)

The solid-state imaging device according to any one of (1) to (21), in which a first physical film thickness of the first insulating film is smaller than a second physical film thickness of the second insulating film.

(23)

A solid-state imaging device including:
a semiconductor layer;
a photoelectric converter that is provided in the semiconductor layer, and generates an electric charge corresponding to a received light amount by photoelectric conversion;
a storage capacitor that is provided on the semiconductor layer, and includes a first insulating film having a first dielectric strength voltage; and
a first transistor that is provided on the semiconductor layer, and includes a second insulating film having a second dielectric strength voltage higher than the first dielectric strength voltage.

(24)

An electronic apparatus provided with a solid-state imaging device, the solid-state imaging device including:
a semiconductor layer;
a photoelectric converter that is provided in the semiconductor layer, and generates an electric charge corresponding to a received light amount by photoelectric conversion;
a storage capacitor that is provided on the semiconductor layer, and includes a first insulating film having a first electrical film thickness; and
a first transistor that is provided on the semiconductor layer, and includes a second insulating film having a second electrical film thickness larger than the first electrical film thickness.

This application claims the benefit of Japanese Priority Patent Application JP2018-216342 filed with the Japan Patent Office on Nov. 19, 2018 and Japanese Priority Patent Application JP2019-206785 filed with the Japan Patent Office on Nov. 15, 2019, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a semiconductor layer;
a photoelectric converter that is provided in the semiconductor layer, and generates an electric charge corresponding to a received light amount by photoelectric conversion;
a storage capacitor that is provided on the semiconductor layer, and includes a first insulating film having a first electrical film thickness;
a first transistor that is provided on the semiconductor layer, and includes a second insulating film having a second electrical film thickness larger than the first electrical film thickness and a first gate electrode; and a second transistor that is provided on the semiconductor layer, and includes a third insulating film having a third electrical film thickness smaller than the second electrical film thickness, wherein the second transistor includes a second gate electrode, wherein the first insulating film and the third insulating film have different thicknesses, wherein the storage capacitor is provided between the first transistor and the second transistor in a cross-sectional view, wherein the storage capacitor further includes a metal layer and an impurity diffusion layer that extends beyond the metal layer in the cross-sectional view, wherein the first insulating film is provided between the metal layer and the impurity diffusion layer without extending beyond the impurity diffusion layer and edge-aligned with the metal layer in the cross-sectional view, and wherein the first gate electrode has a length less than a length of the second gate electrode.

2. The solid-state imaging device according to claim 1, wherein the second transistor comprises an amplification transistor, and the third insulating film comprises a gate insulating film of the amplification transistor.

3. The solid-state imaging device according to claim 1, wherein the storage capacitor is stacked at a position overlapping the photoelectric converter in a thickness direction of the semiconductor layer.

4. The solid-state imaging device according to claim 3, wherein
the first transistor comprises a vertical transistor including the first gate electrode, as a second electrically conductive layer, extending in the thickness direction of the semiconductor layer, and
the second insulating film comprises a gate insulating film of the vertical transistor.

5. The solid-state imaging device according to claim 4, wherein a maximum value of a physical film thickness of the first insulating film is smaller than a minimum value of a physical film thickness of the second insulating film.

6. The solid-state imaging device according to claim 4, wherein
the first gate electrode of the vertical transistor includes a plug inserted into a trench that is formed in the semiconductor layer and extends in the thickness direction, and
the trench has a wall surface and a bottom surface entirely covered by the second insulating film.

7. The solid-state imaging device according to claim 1, wherein the storage capacitor comprises a MOS capacitor.

8. The solid-state imaging device according to claim 7, wherein the MOS capacitor is of a planar type.

9. The solid-state imaging device according to claim 1, wherein the storage capacitor stores the electric charge generated by the photoelectric converter.

10. The solid-state imaging device according to claim 1, further comprising an adjacent pixel provided in the semiconductor layer to be disposed adjacent to a pixel including the photoelectric converter and the storage capacitor,
wherein the adjacent pixel includes an adjacent photoelectric converter that generates an electric charge corresponding to a received light amount by photoelectric conversion, and wherein the storage capacitor stores the electric charge generated by the photoelectric converter, and also stores the electric charge generated by the adjacent photoelectric converter.

11. The solid-state imaging device according to claim 10, wherein the storage capacitor is provided over both the photoelectric converter and the adjacent photoelectric converter in an in-plane direction of the semiconductor layer.

12. The solid-state imaging device according to claim 10, wherein sensitivity of the photoelectric converter is higher than sensitivity of the adjacent photoelectric converter.

13. The solid-state imaging device according to claim 1, further comprising an adjacent pixel provided in the semiconductor layer to be disposed adjacent to a pixel including the photoelectric converter and the storage capacitor,
wherein the adjacent pixel includes an adjacent photoelectric converter that generates an electric charge corresponding to a received light amount by photoelectric conversion, and
wherein the storage capacitor stores the electric charge generated by the adjacent photoelectric converter.

14. The solid-state imaging device according to claim 1, wherein the first transistor comprises a transfer transistor that transfers the electric charge from the photoelectric converter to a transfer destination.

15. The solid-state imaging device according to claim 14, further comprising an electric charge-voltage converter as the transfer destination, theelectric charge-voltage converter that is provided in the semiconductor layer, and converts the electric charge generated by photoelectric converter into a voltage.

16. The solid-state imaging device according to claim 15, wherein the storage capacitor is coupled to the electric charge-voltage converter.

17. The solid-state imaging device according to claim 15, wherein the storage capacitor comprises an electric charge holding section as the transfer destination, the electric charge holding section that is provided between the photoelectric converter and the electric charge-voltage converter, and temporarily holds the electric charge generated by the photoelectric converter before transferring the electric charge to the electric charge-voltage converter.

18. The solid-state imaging device according to claim 15, further comprising a switching section that is provided between the storage capacitor and the electric charge-voltage converter, and performs electrical coupling between the storage capacitor and the electric charge-voltage converter and electrical disconnection between the storage capacitor and the electric charge-voltage converter.

19. The solid-state imaging device according to claim 1, wherein a first dielectric constant of the first insulating film is higher than a second dielectric constant of the second insulating film.

20. The solid-state imaging device according to claim 1, wherein a first physical film thickness of the first insulating film is smaller than a second physical film thickness of the second insulating film.

21. A solid-state imaging device, comprising:
a semiconductor layer;
a photoelectric converter that is provided in the semiconductor layer, and generates an electric charge corresponding to a received light amount by photoelectric conversion;
a storage capacitor that is provided on the semiconductor layer, and includes a first insulating film having a first dielectric strength voltage;

a first transistor that is provided on the semiconductor layer, and includes a second insulating film having a second dielectric strength voltage higher than the first dielectric strength voltage and a first gate electrode; and a second transistor that is provided on the semiconductor layer, and includes a third insulating film having a third dielectric strength voltage smaller than the second dielectric strength voltage, wherein the second transistor includes a second gate electrode, wherein the first insulating film and the third insulating film have different dielectric strength voltages, wherein the storage capacitor is provided between the first transistor and the second transistor in a cross-sectional view, wherein the storage capacitor further includes a metal layer and an impurity diffusion layer that extends beyond the metal layer in the cross-sectional view, wherein the first insulating film is provided between the metal layer and the impurity diffusion layer without extending beyond the impurity diffusion layer and edge-aligned with the metal layer in the cross-sectional view, and wherein the first gate electrode has a length less than a length of the second gate electrode.

22. An electronic apparatus provided with a solid-state imaging device, the solid-state imaging device comprising:

a semiconductor layer;

a photoelectric converter that is provided in the semiconductor layer, and generates an electric charge corresponding to a received light amount by photoelectric conversion;

a storage capacitor that is provided on the semiconductor layer, and includes a first insulating film having a first electrical film thickness;

a first transistor that is provided on the semiconductor layer, and includes a second insulating film having a second electrical film thickness larger than the first electrical film thickness and a first gate electrode; and a second transistor that is provided on the semiconductor layer, and includes a third insulating film having a third electrical film thickness smaller than the second electrical film thickness, wherein the first insulating film and the third insulating film have different thicknesses, wherein the second transistor includes a second gate electrode, wherein the storage capacitor is provided between the first transistor and the second transistor in a cross-sectional view, wherein the storage capacitor further includes a metal layer and an impurity diffusion layer that extends beyond the metal layer in the cross-sectional view, wherein the first insulating film is provided between the metal layer and the impurity diffusion layer without extending beyond the impurity diffusion layer and edge-aligned with the metal layer in the cross-sectional view, and wherein the first gate electrode has a length less than a length of the second gate electrode.

* * * * *